(12) United States Patent
Hiramatsu et al.

(10) Patent No.: US 7,071,551 B2
(45) Date of Patent: Jul. 4, 2006

(54) DEVICE USED TO PRODUCE OR EXAMINE SEMICONDUCTORS

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/030,123

(22) PCT Filed: May 28, 2001

(86) PCT No.: PCT/JP01/04438

§ 371 (c)(1),
(2), (4) Date: May 16, 2002

(87) PCT Pub. No.: WO01/91166

PCT Pub. Date: Nov. 29, 2001

(65) Prior Publication Data

US 2002/0180466 A1 Dec. 5, 2002

(30) Foreign Application Priority Data

May 26, 2000 (JP) ........................ 2000-156876

(51) Int. Cl.
*H01L 23/10* (2006.01)

(52) U.S. Cl. ................ 257/710; 257/708; 257/690; 257/692; 257/693; 257/701; 257/703

(58) Field of Classification Search ............. 257/710, 257/708, 690, 692, 693, 701, 703
See application file for complete search history.

(56) References Cited

U.S. PATENT DOCUMENTS

| 4,880,684 | A | 11/1989 | Boss et al. |
|---|---|---|---|
| 6,174,583 | B1 | 1/2001 | Yamada et al. |
| 6,182,340 | B1 | 2/2001 | Bishop |
| 6,232,669 | B1 | 5/2001 | Khoury et al. |
| 6,465,763 | B1 | 10/2002 | Ito et al. |
| 6,475,606 | B1 | 11/2002 | Niwa |
| 6,507,006 | B1 | 1/2003 | Hiramatsu et al. |
| 6,534,751 | B1 * | 3/2003 | Uchiyama et al. ....... 219/444.1 |
| 6,677,557 | B1 | 1/2004 | Ito et al. |
| 6,710,307 | B1 | 3/2004 | Ito et al. |
| 6,717,116 | B1 | 4/2004 | Ito et al. |
| 6,731,496 | B1 | 5/2004 | Hiramatsu et al. |
| 6,753,601 | B1 | 6/2004 | Hiramatsu et al. |
| 2002/0043527 | A1 | 4/2002 | Ito |
| 2003/0015521 | A1 | 1/2003 | Ito |

FOREIGN PATENT DOCUMENTS

| JP | 55-104096 | 8/1980 |
|---|---|---|
| JP | 182890/1982 | 11/1982 |
| JP | 9-165681 | 6/1997 |
| JP | 10-189222 | 7/1998 |
| JP | 11-339939 | 12/1999 |
| JP | 2000-114354 | 4/2000 |

OTHER PUBLICATIONS

U.S. Appl. No. 10/928,146, filed Aug. 30, 2004, Hiramatsu et al.
U.S. Appl. No. 10/030,123, filed May 16, 2002, Hiramatsu et al.

* cited by examiner

*Primary Examiner*—Nathan J. Flynn
*Assistant Examiner*—Remmon R. Fordé
(74) *Attorney, Agent, or Firm*—Oblon, Spivak, McClelland, Maier & Neustadt, P.C.

(57) ABSTRACT

A semiconductor-producing/examining device that can maintain a preferable connection state for a predetermined period of time and that can easily remove a ceramic substrate from a supporting case. The semiconductor producing/examining device includes a ceramic substrate having a conductor layer formed on the surface thereof or inside thereof and a supporting case. An external terminal is connected to the conductor layer. A connection between the conductor layer and the external terminal is performed such that the external terminal is pressed on the conductor layer or the external terminal is pressed on another conductor layer connected to the conductor layer by using the elastic force and the like of an elastic body.

10 Claims, 15 Drawing Sheets

DEVICE USED TO PRODUCE OR EXAMINE SEMICONDUCTORS

TECHNICAL FIELD

The present invention relates mainly to a semiconductor-producing/examining device used to produce or examine semiconductors such as hot plates (ceramic heaters), electrostatic chucks, wafer probers and the like.

BACKGROUND ART

Hitherto, a heater, wafer prober and the like wherein a base material made of metal such as stainless steel or aluminum alloy is used has been used in semiconductor producing/examining devices and so on, examples of which include an etching device, a chemical vapor deposition device and the like.

However, such a heater made of metal has the following problems.

First, the thickness of the heater plate must be made as thick as about 15 mm since the heater is made of metal. Because in a thin metal plate, a bend, a strain and so on are generated on the basis of thermal expansion resulting from heating so that a silicon wafer put on the metal plate is damaged or inclined. However, if the thickness of the heater plate is made thick, a problem that the heater becomes heavy and bulky arises.

The temperature for heating is controlled by changing the voltage or current amount applied to resistance heating elements. However, since the metal plate is thick, the temperature of the heater plate does not follow the change in the voltage or current amount promptly. Thus, a problem that the temperature is not easily controlled is caused as well.

Thus, JP Kokai Hei 4-324276 proposes a ceramic heater wherein: aluminum nitride, which is a non-oxide ceramic having a high thermal conductivity and a high strength, is used as a substrate; a resistance heating element and a conductor-filled through hole comprising tungsten are made in this aluminum nitride substrate ; and nichrome wires as external terminals are brazed thereto.

SUMMARY OF THE INVENTION

However, in the ceramic heater having the above constitution, the lead wire is soldered with a solder material. For this reason, when the ceramic heater is used in a high-temperature area at a temperature of, for instance, 400 to 500° C. for a long period of time, the solder material may deteriorate, and a void may be formed there to decrease the adhesive force of the solder material. Depending on circumstances, an external terminal is detached from the ceramic substrate.

Also, even though the external terminal is not detached, for example, when the resistance value of the connecting portion is increased by deterioration such as oxidation of the solder material and the like, heat is generated by the portion, or a current flowing in the entire resistive heating element changes. For this reason, the temperature control of the ceramic substrate is interfered.

In addition, it is assumed that the external terminal is connected by soldering and the like. In this case, a problem that after the ceramic substrate is arranged in a supporting case and a wiring and the like is arranged, the ceramic substrate cannot be easily removed existed.

The present invention is completed to solve the above-mentioned problem, and has its object to provide a semiconductor-producing/examining device: which can satisfactorily maintain a connection between a conductor layer formed at a ceramic substrate and an external terminal for a long period of time; and which can easily be removed from a supporting case. It is another object to provide a semiconductor-producing/examining device which can be suitably used as a hot plate, an electrostatic chuck, a wafer prober and the like.

The present invention is a semiconductor producing/examining device comprising: a ceramic substrate having a conductor layer formed on the surface thereof or inside thereof; and a supporting case; in which an external terminal is connected to the conductor layer, wherein a connection between the conductor layer and the external terminal is performed such that: the external terminal is pressed on the conductor layer by using elasticity and the like of an elastic body; or the external terminal is pressed on another conductor layer connected to the conductor layer by using elasticity and the like of an elastic body.

In the semiconductor-producing/examining device according to the present invention, as described above, the connection between the conductor layer and the external terminal arranged on the surface of the ceramic substrate or inside the ceramic substrate is performed such that the external terminal is pressed on the conductor layer and the like by using elasticity and the like of the elastic body. Therefore, unlike a case in which an external terminal is adhered through a solder material and the like, a defective connection between the external terminal and a conductor layer caused by deterioration of the solder material and the like does not occur. Thus, preferable connection state can be maintained for a long period of time. In addition, since the connection between the conductor layer and the external terminal is performed by bringing the conductor layer and the external terminal into contact with each other, the ceramic substrate can be easily removed from the supporting case.

As the elastic body, a leaf spring or a coil spring can be used. An example of a material of the coil spring or the leaf spring includes a metal. Examples of the metal include a stainless steel, inconel, a steel, aluminum, nickel, copper and the like.

The connection between the conductor layer arranged at the ceramic substrate and the external terminal, or the connection between said another conductor layer and the external terminal is desirably performed through a non-oxidizable metal layer. This is because the surface of the conductor layer or another conductor layer connected to the conductor layer is prevented from being oxidized.

Examples of a non-oxidizable metal include a noble metal, nickel, a stainless steel and the like. In particular, a combination between nickel and a noble metal is desirable. The thickness of such a non-oxidizable metal layer is preferably 0.01 to 100 μm.

Examples of the noble metal include gold, platinum, palladium and the like. The thickness of such a noble metal layer is preferably 0.01 to 1 μm. The thickness of the nickel layer is preferably 0.1 to 10 μm.

In addition, on a face of the ceramic substrate, which is the face opposite to the face for processing the semiconductor, the connection between the conductor layer and the external terminal or the connection between said another conductor layer and the external terminal is desirably performed. This is because heat can be prevented from escaping through the external terminal.

JP Kokai Hei 3-230489 discloses a technique which is related to a ceramic heater for evaporating kerosene, and which exposes a heating element and connects a terminal of a lead wire to the heating element by pressing the terminal with a spring.

However, this technique is not related to a semiconductor-producing/examining device. If the technique is used in a semiconductor-producing/examining device, a heating element is exposed on a face for processing a semiconductor, and an external terminal is pressed on the heating element. For this reason, heat escapes through the external terminal, and a new problem that the face for processing the semiconductor has poor temperature evenness occures. Therefore, it is additionally noted that the novelty and unobviousness of the present invention are not affected due to the existence of the above-mentioned publication.

| Explanation of symbols | |
|---|---|
| 2 | Chuck top conductor layer |
| 6 | Guard electrode |
| 7 | Ground electrode |
| 8 | Groove |
| 9 | Suction hole |
| 11 | Heat insulating ring |
| 12 | Supporting case |
| 13, 43 | External terminal |
| 14 | Bottom plate |
| 14a | Through hole |
| 15 | Intermediate plate |
| 16 | Leaf spring |
| 17 | Lead wire |
| 18 | Wire |
| 19 | Guide pipe |
| 20 | Ceramic heater |
| 21, 31, 61, 71, 81 | Ceramic substrate |
| 21a, 31a | Heating face |
| 21b, 31b | Bottom face |
| 21c | Concave portion |
| 22, 51, 66 | Resistance heating element |
| 24 | Bottomed hole |
| 25 | Through hole |
| 27 | Cooling pipe |
| 28 | Temperature-measuring element |
| 29 | Silicon wafer |
| 37 | Blind hole |
| 38, 68 | Conductor-filled through hole |
| 39 | Non-oxidizable metal layer |
| 44 | Coil spring |
| 45 | Terminal Supporting tool |
| 45a | Stopper |
| 46 | Insulator |
| 62, 72, 82a, 82b | Chuck positive electrostatic layer |
| 63, 73, 83a, 83b | Chuck negative electrostatic layer |
| 64 | Dielectric film |
| 130 | Connection member |
| 140 | Fixing tool |
| 220 | Metal covering layer |

DETAILED DISCLOSURE OF THE INVENTION

A semiconductor-producing/examining device according to the present invention is a semiconductor producing/examining device comprising: a ceramic substrate having a conductor layer formed on the surface thereof or inside thereof; and a supporting case; in which an external terminal is connected to the conductor layer, wherein a connection between the conductor layer and the external terminal is performed such that: the external terminal is pressed on the conductor layer by using elasticity and the like of an elastic body; or the external terminal is pressed on another conductor layer connected to the conductor layer by using elasticity and the like of an elastic body. The semiconductor-producing/examining device according to the present invention will be described below with reference to the drawings.

Figure 1:
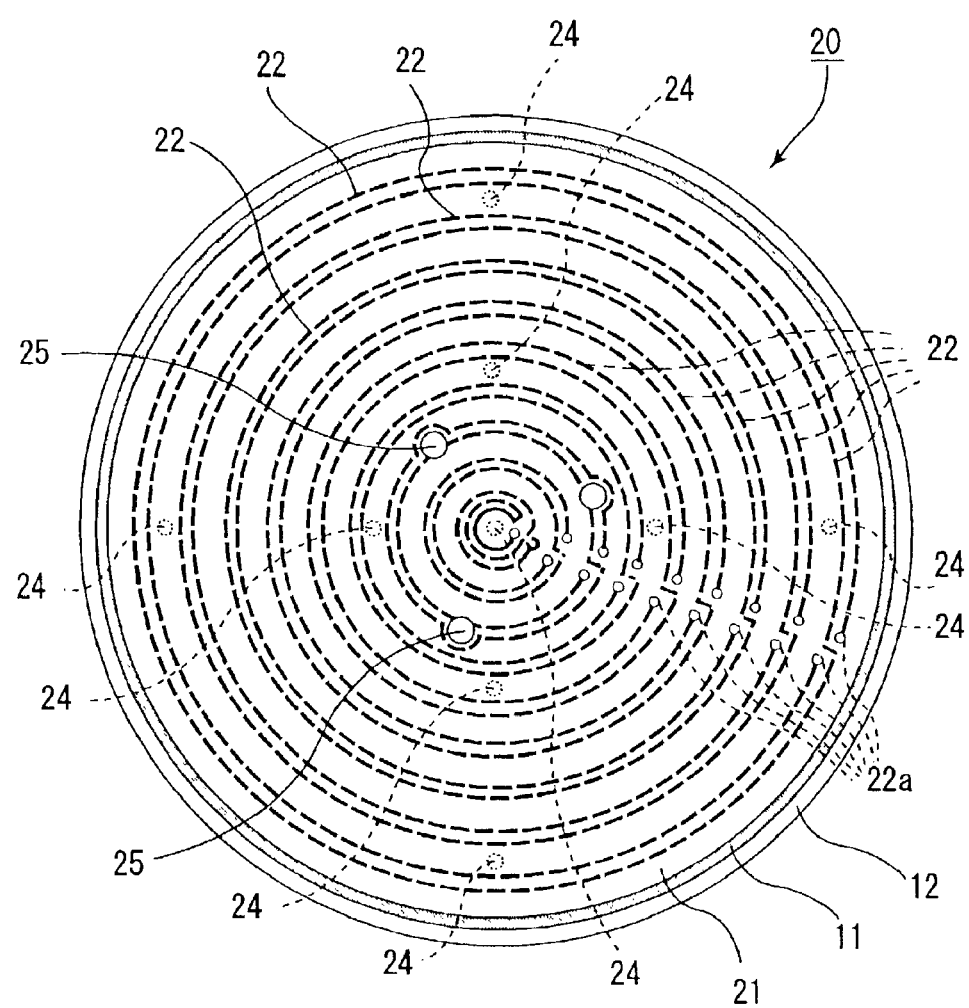
FIG. 1 is a plan view schematically showing a ceramic heater serving as an example of a semiconductor-producing/examining device of the present invention.
Figure 2:
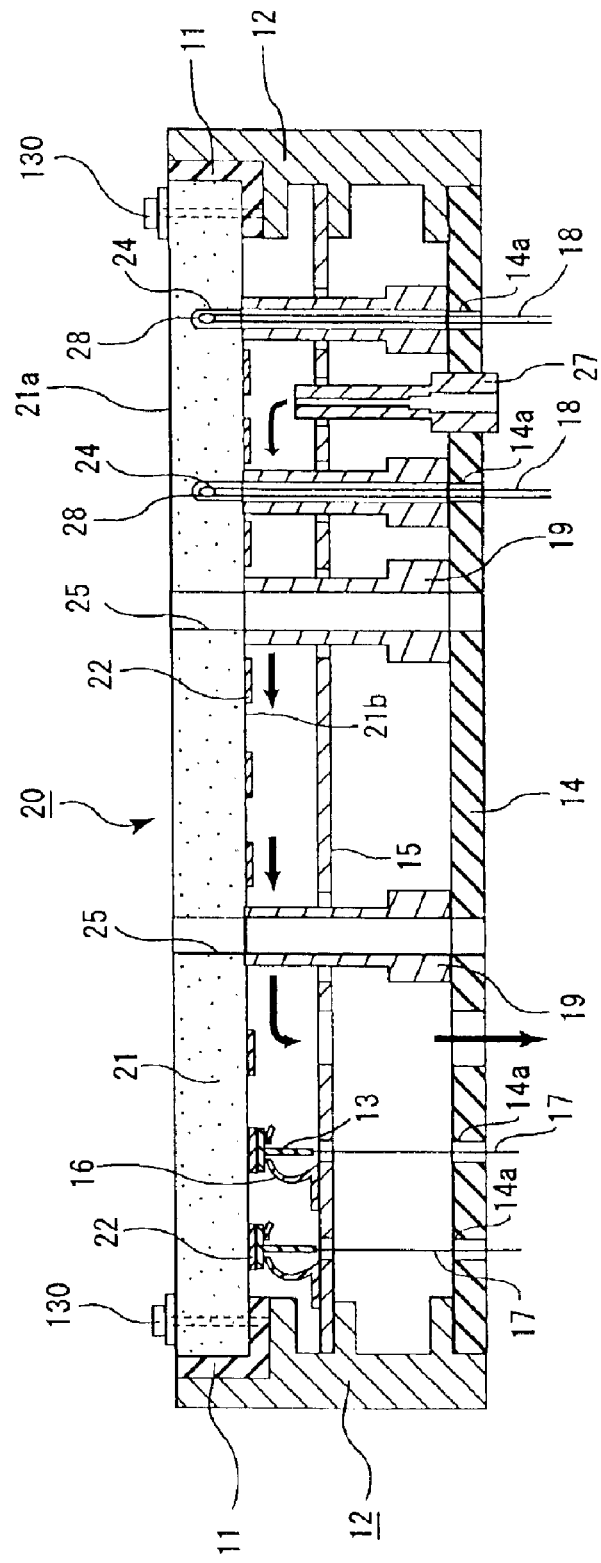
FIG. 2 is a longitudinal sectional view of the ceramic heater shown in FIG. 1.

FIG. 1 is a bottom view schematically showing an example of a ceramic heater (hereinafter, to be referred to as a hot plate as well) which is an embodiment of the semiconductor-producing/examining device according to the present invention, and FIG. 2 is a longitudinal sectional view schematically showing the ceramic heater.

A ceramic substrate 21 is formed to have a disk-like shape, and resistance heating elements 22 are formed on the bottom face of the ceramic substrate 21 to have a concentric circles-like pattern. These resistance heating elements 22 are connected such that two concentric circles neighboring each other constitute one line as a set of circuits.

A plurality of through holes 25 in which lifter pins for carrying and the like of a silicon wafer are to be inserted are formed at positions close to the center. Guide pipes 19 which communicate with the through holes 25 are formed immediately below the through holes 25. Through holes which communicate with the guide pipes 19 are also formed in a bottom plate 14 of a supporting case 12.

On the other hand, bottomed holes 24 in which temperature-measuring elements 28 such as thermocouples are to be inserted are formed in the bottom face of the ceramic substrate 21. Wires 18 are led from the temperature-measuring elements 28 and drawn out of through holes 14a of the bottom plate.

The ceramic substrate 21 having these constitution is fitted on the upper portion of the cylindrical supporting case 12 through a heat insulating ring 11, and is screwed with connection members 130 such as bolts and the like to be fixed to the supporting case 12. An intermediate plate 15 is fixed in the middle of the supporting case 12, and the bottom plate 14 is fixed to the lower portion of the supporting case 12.

A leaf spring 16 consisting of a spring steel and the like is arranged at a portion, which is close to an end portion 22a of the resistance heating element 22, of the intermediate plate 15. An external terminal 13 is pressed on the end portion 22a of the resistance heating element 22, so that electric connection is achieved.

A lead wire 17 is fixed to the external terminal 13. The lead wire 17 is drawn out of the through hole 14a of the bottom plate to be connected to a power supply (not shown). A method of connecting the external terminal 13 will be described later in detail.

A coolant guide pipe 27 is fixed to the bottom plate 14 of the supporting case 12 such that cooling air and the like can be flowed into the inside of the supporting case 12. In the intermediate plate 15, through holes are formed so as not to be the obstacles of the guide pipes 19, a coolant guide pipe 29 and the like which are arranged on the bottom plate 14.

The bottom plate 14 may be integrally formed together with the supporting case 12. The leaf spring 16 may be arranged on the bottom plate 14.

As described above, a plurality of through holes 25 through which lifter pins are to be inserted are formed in the ceramic substrate 21. When a silicon wafer is supported by the plurality of lifter pins, the silicon wafer can be held in such a manner that the silicon wafer is held apart from the upper face of the ceramic substrate by a given distance, and heating and the like can be performed.

A silicon wafer may be directly put on the upper face of the ceramic substrate.

It is possible to form through holes or concave portions in the ceramic substrate 21, insert supporting pins whose tips are in an aspire shape or a hemispherical shape into the through holes or the concave portions, fix the supporting pins in the state that the pins are slightly projected from the ceramic substrate 21. Thus, the silicon wafer can be held in such a state that the silicon wafer is apart from the upper face of the ceramic substrate 21 by a given distance.

A method of connecting the external terminal 13 will be described below in detail.

Figure 3:
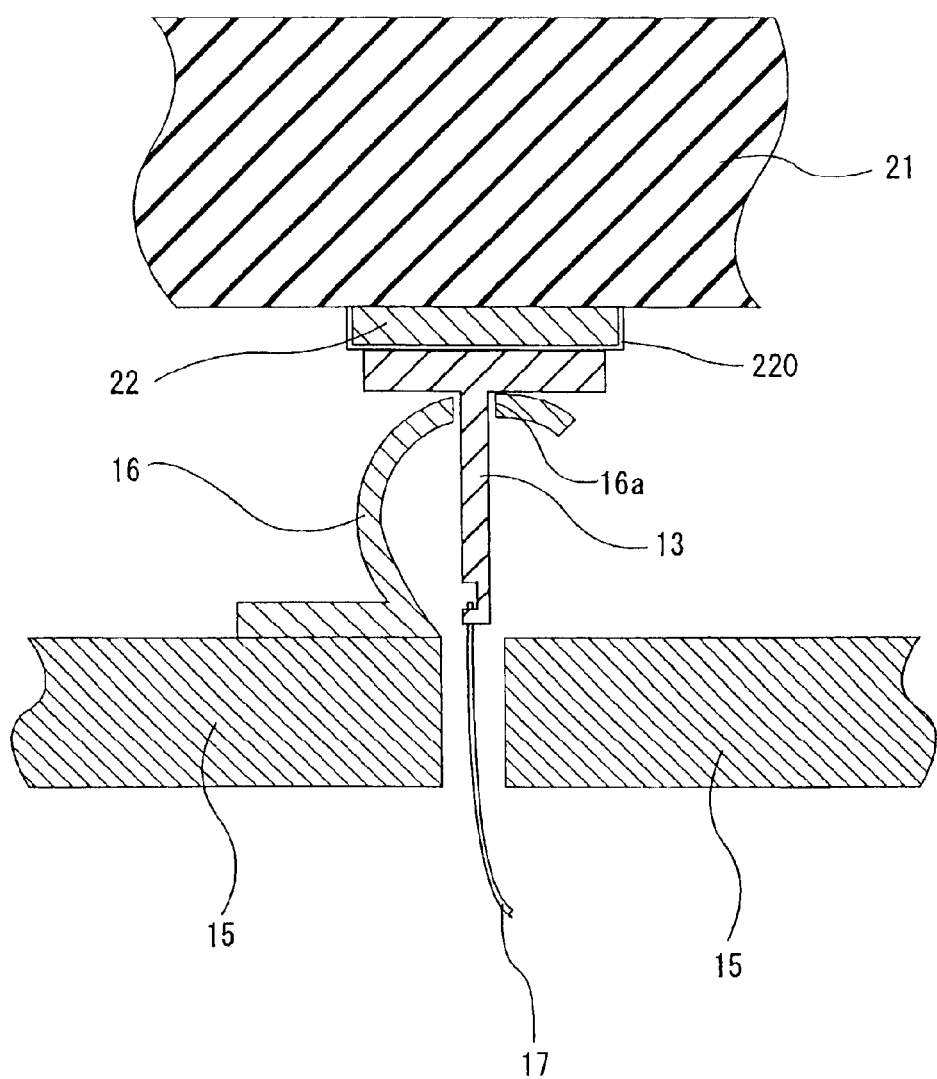
FIG. 3 is a partially enlarged sectional view schematically showing a method of connecting an end portion of a resistance heating element and an external terminal in the ceramic heater shown in FIG. 1.
Figure 4:
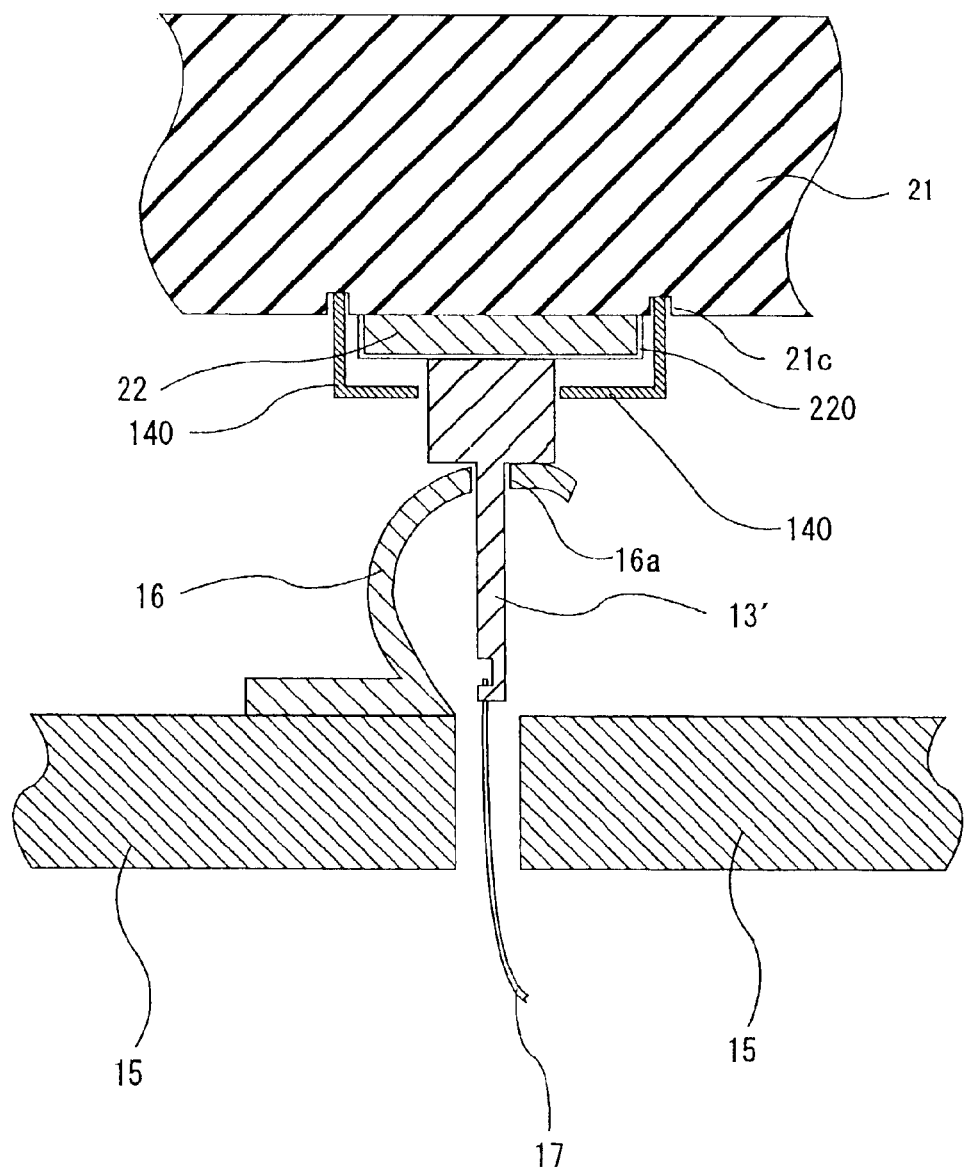
FIG. 4 is a partially enlarged sectional view schematically showing an example of a method of connecting an end portion of a resistance heating element and an external terminal in a ceramic heater in which the resistance heating element is formed on a bottom face of a ceramic substrate.

FIG. 3 is a sectional view schematically showing a method of connecting the external terminal 13 and the resistance heating element 22 by using the leaf spring 16, and FIG. 4 is a sectional view schematically showing another embodiment obtained when the leaf spring 16 is used.

As shown in FIG. 3, the external terminal 13 has a T-shaped cross section and the lead wire 17 is connected to a bottom end of the external terminal. On the intermediate plate 15, a leaf spring 16 which is formed by partially bending a tape-like spring steel plate to have a section shown in FIG. 3 is arranged. A through hole 16a in which the external terminal 13 is to be passed through is formed in the uppermost portion of the leaf spring 16.

The external terminal 13 is inserted in the through hole 16a, and the ceramic substrate 21 is fitted in the supporting case 12 so that the resistance heating element 22 is pressed on the end portion 22a of the resistance heating element 22, as shown in FIG. 3. Thus, the external terminal 13 is electrically connected to the resistance heating element 22. On the resistance heating element 22, a metal covering layer 220 is formed to prevent oxidization and the like of the resistance heating element 22.

Although the lead wire 17 is connected to the lower end of the external terminal 13, the connection between the lead wire 17 and the external terminal 13 is also performed by physical contact. More specifically, the lower end of the external terminal 13 before the connection is performed has a bent shape being a U-shaped cross section or a V-shaped cross section such that an end portion of the lead wire 17 can be sandwiched and fixed by bent portions. After the lead wire 17 is inserted into the bent portion, the bent portion is pressurized from both sides and flattened to integrate the bent portions and the lead wire 17 with each other. In this manner, an end portion of the lead wire 17 is sandwiched and fixed by the lower end of the external terminal 13.

When the above method is used, as shown in FIG. 4, concave portions 21c are formed at both sides of an end portion of the resistance heating element 22a to which a external terminal 13' is connected, and an end portion of a fixing tool 140 having a U-shaped cross section and having a through hole at the center thereof may be inserted in and fixed to the concave portions 21c. In this case, a spring is used as the fixing tool 140, the external terminal 13' can be easily fixed. The fixing tool may be formed integrally with the external terminal 13'.

When the fixing tool 140 is used as described above, the external terminal 13' can be fixed to a predetermined position of the ceramic substrate 21. For this reason, even though the position of the resistance heating element 22 is slightly shifted due to thermal expansion of the ceramic substrate 21 or contraction and the like of the ceramic substrate 21 in a cooling state, the external terminal 13' is successively in contact with the end portion of the resistance heating element 22, and the connection state is maintained.

Figure 5:
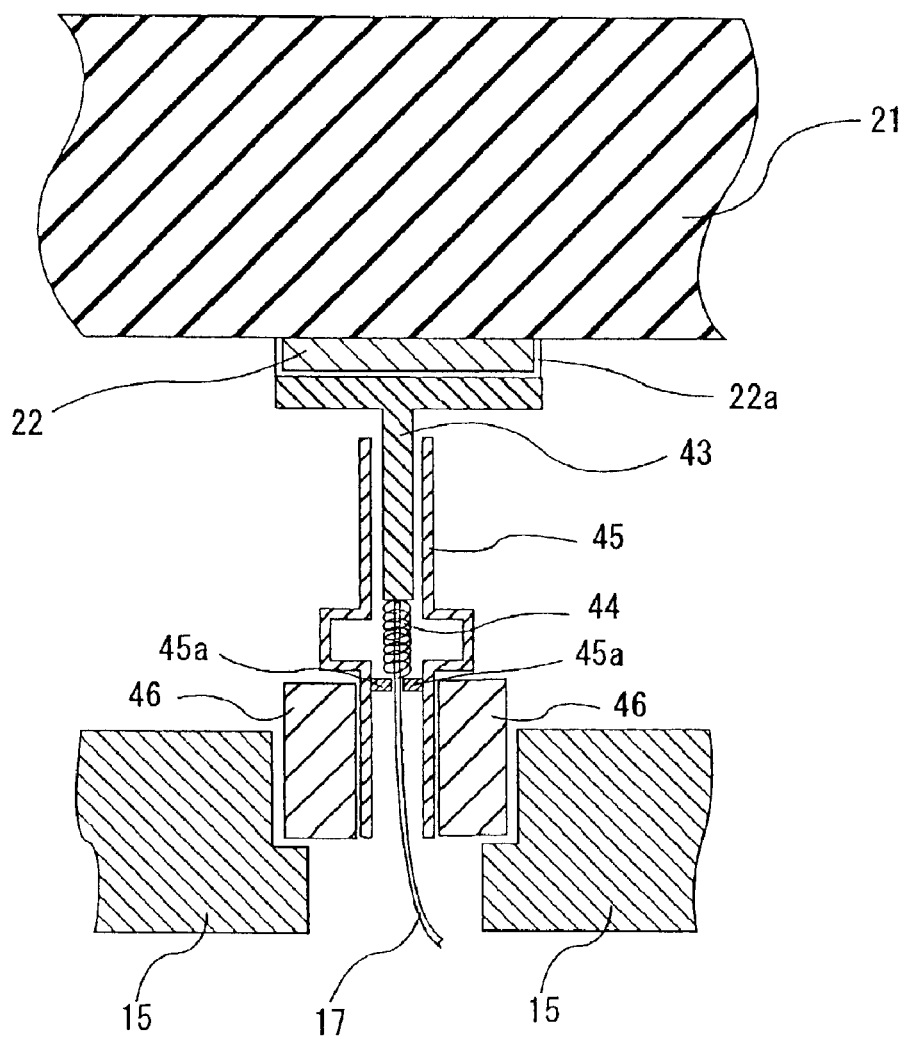
FIG. 5 is a partially enlarged sectional view schematically showing an example of a method of connecting an end portion of a resistance heating element and an external terminal in a ceramic heater in which the resistance heating element is formed on a bottom face of a ceramic substrate.
Figure 6:
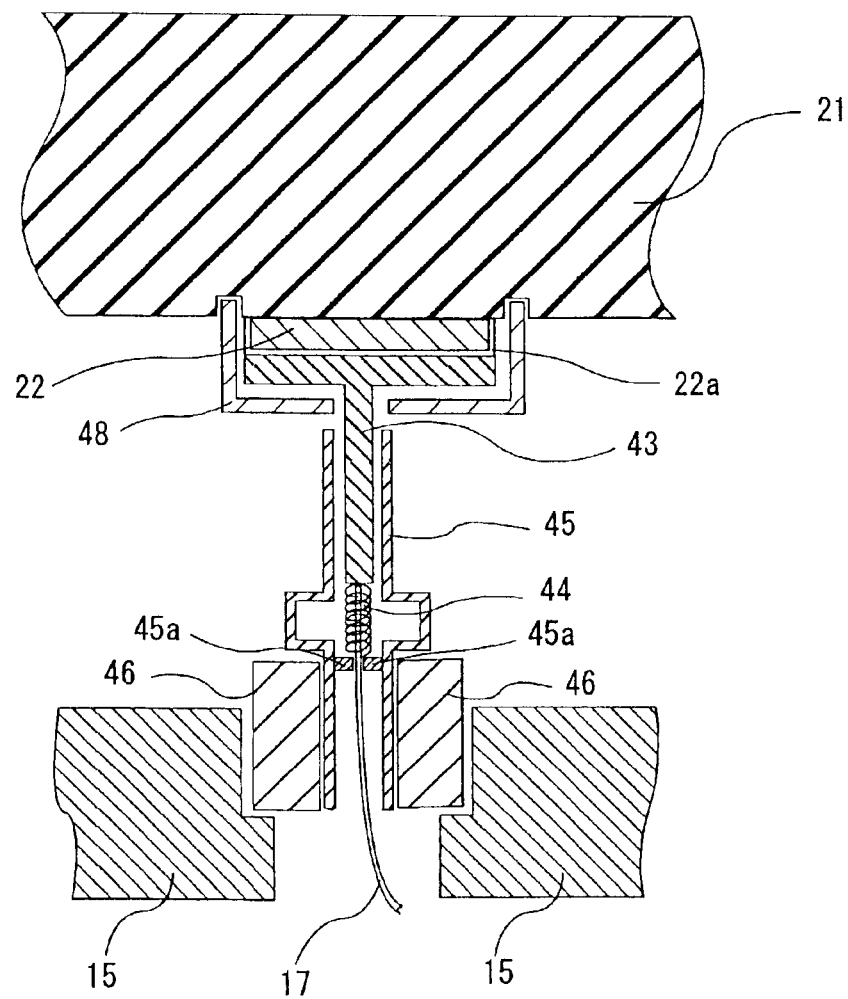
FIG. 6 is a partially enlarged sectional view schematically showing an example of a method of connecting an end portion of a resistance heating element and an external terminal in a ceramic heater in which the resistance heating element is formed on a bottom face of a ceramic substrate.

FIG. 5 is a sectional view schematically showing another method of connecting an external terminal and a resistance heating element when a coil spring is used, and FIG. 6 is a sectional view schematically showing another embodiment obtained when a coil spring is used.

In this case, as shown in FIG. 5, a rod-like portion of an external terminal 43 is inserted into a terminal supporting tool 45 having a generally cylindrical shape, and the external terminal 43 is lifted up by the elastic force of the coil spring 44 built in the terminal supporting tool 45 to be pressed on the end portion of the resistance heating element 22a. A stopper 45a for supporting the coil spring 44 is formed inside the terminal supporting tool 45. The terminal supporting tool 45 having such s constitution is fitted in a cylindrical insulator 46 having a thick wall and fixed to the insulator 46. Also, the insulator 46 is fitted in the through hole of the intermediate plate 15 and fixed to the intermediate plate 15. Although not shown, at the lower end of the external terminal 43, an end portion of the lead wire 17 is sandwiched and fixed by using the same method as that in the case of using the external terminal 13 shown in FIGS. 3 and 4.

In this case, as shown in FIG. 6, when the fixing tool 48 having a U-shaped cross section is used, even though the ceramic substrate 21 thermally expands or contracts in a cooling state, a deviation is not generated between the resistance heating element 22 and the external terminal 43, and a preferable connection state can be maintained. In this case, the external terminal 43 and the fixing tool 48 may be integrated with each other as well.

In this manner, on a face of the ceramic substrate, which is the face opposite to the face for processing the semiconductor, the connection between the conductor layer and the external terminal, or the connection between said another conductor layer and the external terminal is performed. For this reason, the face for processing the semiconductor can assure temperature evenness. In particular, the temperature evenness when the temperature of a ceramic heater is increased to 100° C. or higher is improved.

The methods of connecting the external terminals have been described above with reference to FIGS. 3 to 6. A method used in the present invention is not limited to the above-mentioned methods as far as it performs a connection by bringing an external terminal into pressed contact with a resistance heating element by using a spring.

The materials of the leaf spring 16 and the coil spring 44 are not limited to specific materials. Examples of the materials include a carbon-based steel, a silicon-manganese-based steel, a chromium-vanadium-based steel, a stainless steel, inconel, aluminum, nickel, copper and the like.

The material of the external terminal 23 is not limited to a specific material. Examples of the material include metals such as nickel, Kovar and the like.

The external terminal 23 preferably has a T-shaped cross section to increase the area of the contact face. Since the size of the external terminal 23 is appropriately adjusted depending on: the size of the ceramic substrate 21 to be used; the size of the resistance heating element 22 and the like, the size of the external terminal 23 is not limited to a specific size. However, the shaft portion of the external terminal 23 preferably has a diameter of 0.5 to 10 mm and a length of 3 to 20 mm.

In the ceramic heater shown in FIG. 1, the ceramic substrate is fitted in the supporting case through the heat insulating ring. However, the ceramic heater may have the following constitution. That is, a ceramic substrate is placed on a supporting case, and the ceramic substrate is fixed to the upper face of the supporting case through a heat insulating member and the like by using a connection member such as a bolt.

Figure 7:
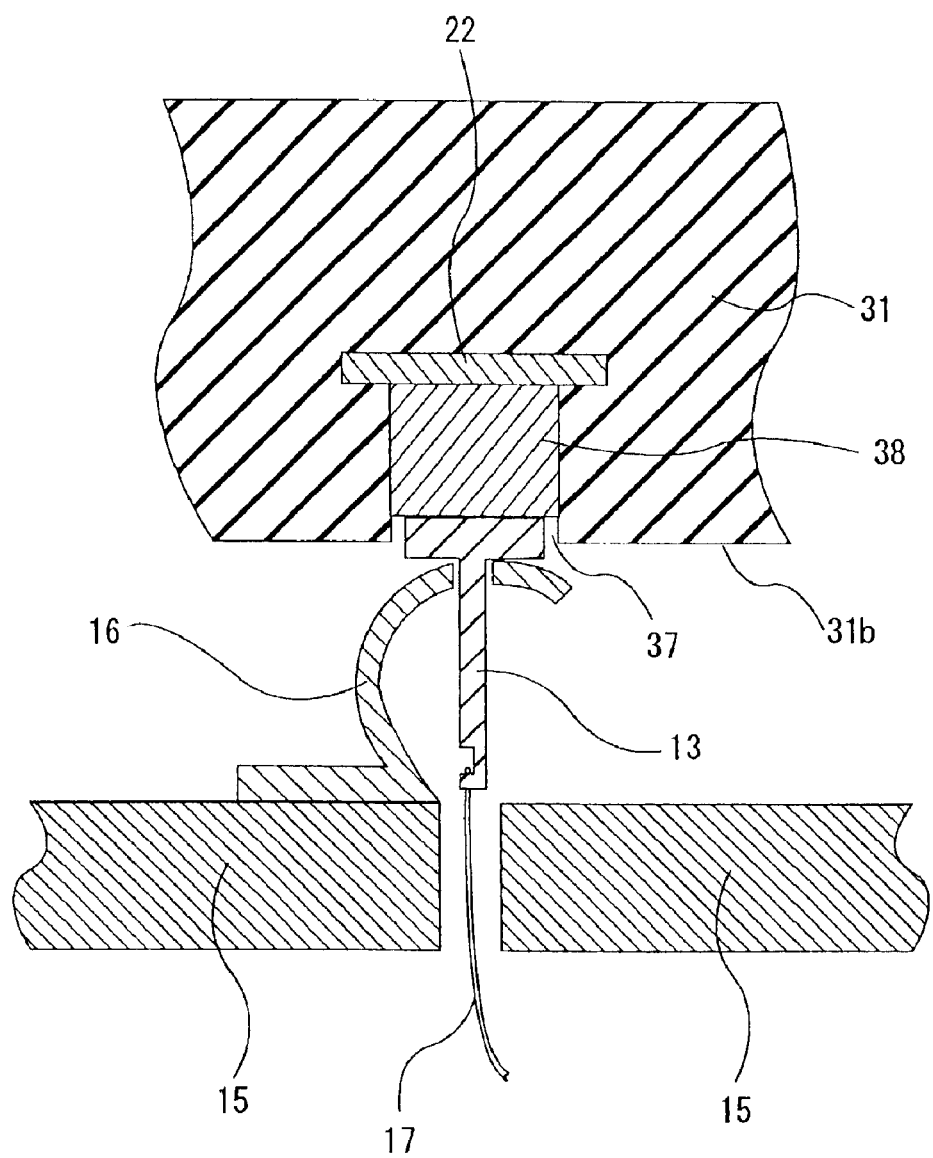
FIG. 7 is a partially enlarged sectional view schematically showing an example of a method of connecting an end portion of a resistance heating element and an external terminal in a ceramic heater in which the resistance heating element is formed inside a ceramic substrate.

FIG. 7 shows another embodiment of the present invention, and is a partially enlarged sectional view schematically showing a portion near a resistance heating element of a ceramic heater in which the resistance heating element is arranged inside a ceramic substrate.

Although not shown, a ceramic substrate 31 is formed to have a disk-like shape as in the case shown in FIG. 1, and resistance heating elements 22 are formed inside the ceramic substrate 31 to have a concentric circles-like pattern. A conductor-filled through hole 38 is formed immediately below both the ends of the circuits of these resistance heating elements 22, and a blind hole 37 is formed to expose the conductor-filled through hole 38.

As in the case shown in FIG. 3, by using elasticity of a leaf spring 16, an external terminal 13 is pressed on the conductor-filled through hole 38 exposed from the blind hole 37. The external terminal 13 and the resistance heating element 22 are electrically connected to each other through the conductor-filled through hole 38.

Figure 8:
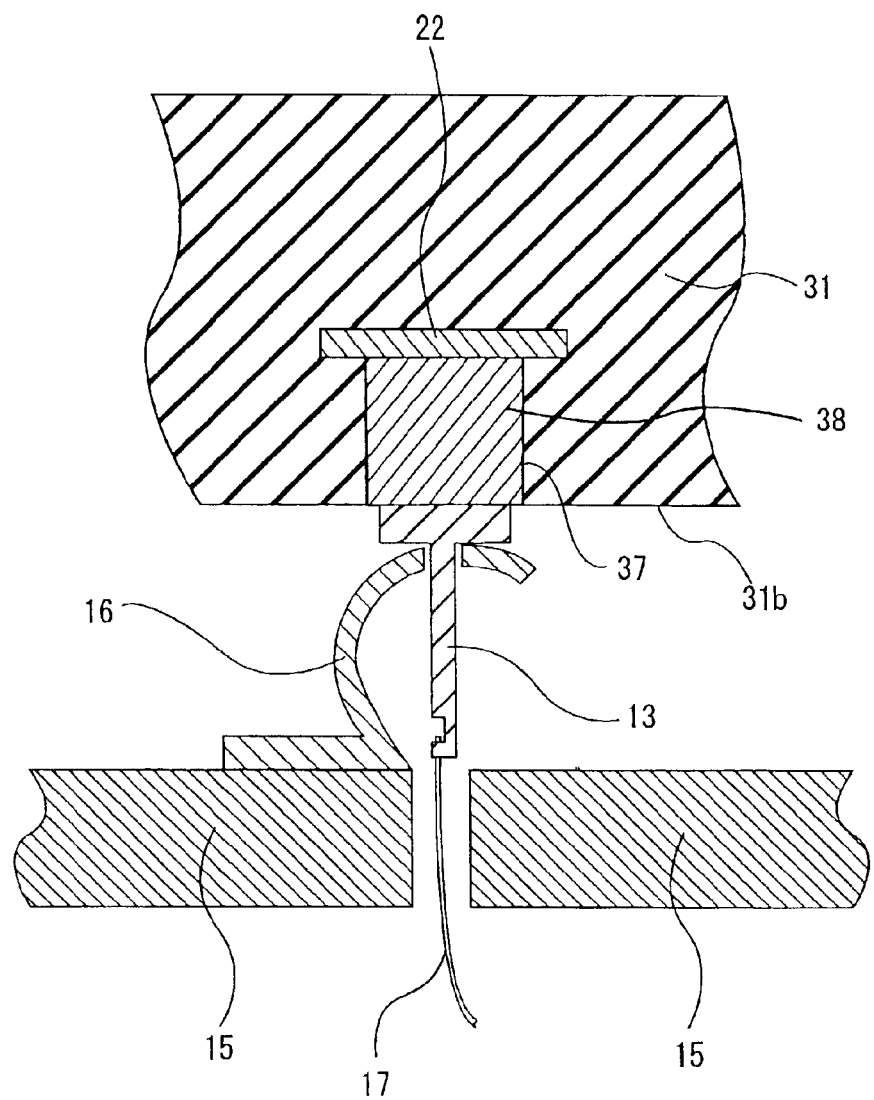
FIG. 8 is a partially enlarged sectional view schematically showing an example of a method of connecting an end portion of a resistance heating element and an external terminal in a ceramic heater in which the resistance heating element is formed inside a ceramic substrate.
Figure 9:
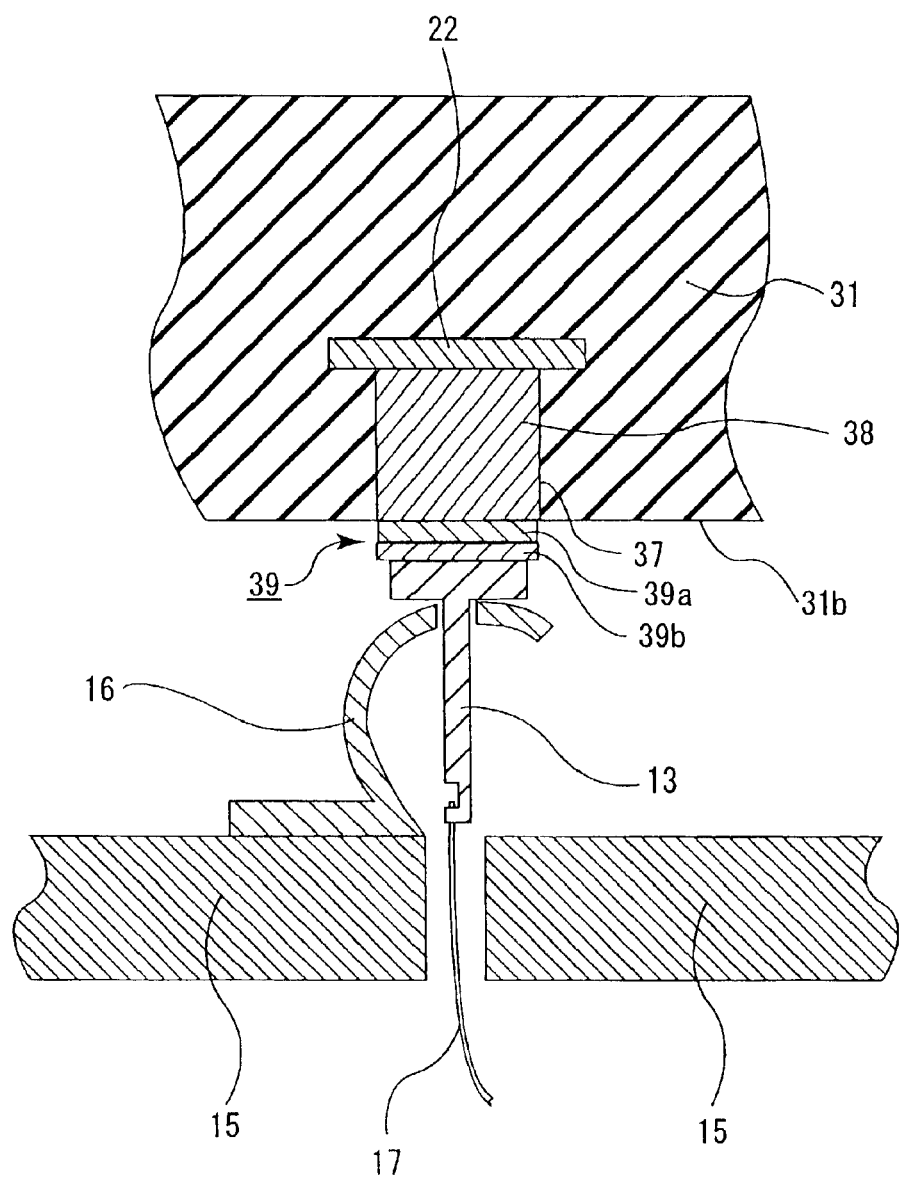
FIG. 9 is a partially enlarged sectional view schematically showing an example of a method of connecting an end portion of a resistance heating element and an external terminal in a ceramic heater in which the resistance heating element is formed inside a ceramic substrate.

The conductor-filled through hole 38 may be formed to be exposed to the bottom face and no blind hole may be formed as shown in FIG. 8. As shown in FIG. 9, a non-oxidizable metal layer 39 comprising an Ni layer 39a and an Au layer 39b may be formed on the surface of the conductor-filled through hole 38, and the external terminal 13 and the conductor-filled through hole 38 may be connected to each other through the non-oxidizable metal layer 39. In this case, the non-oxidizable metal layer 39 can be formed by a sputtering process, a plating process and the like. However, before such a plating process and the like is performed, the surface of conductor-filled through hole is desirably subjected to grinding and the like to remove an oxide layer and the like.

As described above, in the ceramic heater, by using the elastic force of a metal spring (leaf spring 16 or coil spring 44), the external terminal is pressed on the end portion of the resistance heating element directly or through the conductor-filled through hole so that the end portion of the resistance heating element and the external terminal are connected each other. Therefore, unlike a case in which a solder material and the like is used, a defective connection between an external terminal and a conductor layer does not occur, and a preferable connection state can be maintained for a long period of time.

The conductor-filled through hole 38 comprises a metal such as tungsten or molybdenum, or a carbide of these metal and the like. The diameter of the conductor-filled through hole 38 is desirably 0.1 to 10 mm. This is because cracks and distortion can be prevented while preventing disconnection.

The size of the blind hole 37 is not limited to a specific size. The blind hole 37 may have such a size that the head of the external terminal 13 is just enough to be inserted into the blind hole 37.

In the present invention, the resistance heating element desirably comprises a noble metal (gold, silver, platinum or palladium), a metal such as lead, tungsten, molybdenum or nickel and the like or an electrically conductive ceramic such as a carbide and the like of tungsten or molybdenum. This is because the resistance value can be made high, and the thickness itself of the resistance heating element can be made large to prevent disconnection and the like. Furthermore, these materials are not easily oxidized, and the heat conductivity does not easily decrease. These materials may be used alone or in combination of two or more.

In order to make the temperature of the entire ceramic substrate even, the resistance heating elements preferably employ a concentric circles-like pattern as shown in FIG. 1 or a combination of the concentric circles-like pattern and a winding-line pattern. The resistance heating element preferably has a thickness of 1 to 50 μm and a width of 5 to 20 mm.

The resistance value of the resistance heating element can be changed by changing the thickness and the width of the resistance heating element, and this range of the resistance value is the most practical range. The resistance value of the resistance heating element increases as the resistance heating element becomes thin or narrow.

When the resistance heating element is inside the ceramic substrate, the distance between a heating face 21a and the resistance heating element 22 becomes small, and the evenness of the surface temperature deteriorates. For this reason, the width of the resistance heating element 22 itself must be increased. Since the resistance heating element 22 is arranged inside the ceramic substrate, adhesion between the resistance heating element 22 and a ceramic nitride and the like need not be considered.

The cross section of resistance heating element may employ one of a square shape, an elliptical shape, a spindle shape and a semicylindrical shape. However, the resistance heating element is preferably flat. When the resistance heating element is flat, heat can be easily radiated toward the heating face. For this reason, an amount of heat transmission to the heating face can be increased, and a temperature distribution is not easily generated on the heating face.

The resistance heating element may have a spiral shape.

In order to form the resistance heating element on the bottom face of the ceramic substrate or inside the ceramic substrate, a conductor containing paste comprising a metal or an electrically conductive ceramic is preferably used.

More specifically, in case that a resistance heating element is formed on the surface of the ceramic substrate 21 as shown in FIGS. 1 and 2, firing is generally performed to produce the ceramic substrate 21. Namely, the conductor containing paste layer is formed on the surface of the ceramic substrate 21 and fired to produce a resistance heating element. On the other hand, in case a resistance heating element is to be formed inside the ceramic substrate 31 as shown in FIG. 4, the conductor containing paste layer is formed on a green sheet. Thereafter, the green sheet is stacked and fired to produce a resistance heating element inside the ceramic substrate 31.

The conductor containing paste is not specifically limited. However, a conductor containing paste containing metal particles or electrically conductive ceramic particles to assure conductivity and containing a resin, a solvent, a thickener and the like is preferably used.

Examples of the material of the metal particles or the electrically conductive ceramic particles include the above-mentioned materials. The particle diameters of the metal particles or the electrically conductive ceramic particles are preferably 0.1 to 100 μm. When the particle diameters are excessively small, i.e., less than 0.1 μm, the particles are easily oxidized. On the other hand, the particle diameters exceed 100 μm, the conductor containing paste is not easily sintered, and the resistance value of the conductor containing paste becomes large.

The shapes of the metal particles may be spherical or scaly. When these metal particles are used, a mixture of spherical metal particles and scaly metal particles may be used.

The scaly metal particles or the mixture of spherical metal particles and scaly metal particles are advantageously used for the following reasons. That is, a metal oxide between the metal particles can be easily held, the adhesion between the resistance heating element and the ceramic substrate is made reliable, and the resistance value can be made large.

Examples of the resin used in the conductor containing paste include an epoxy resin, a phenol resin and the like. Examples of the solvent include isopropyl alcohol and the like. Examples of the thickener include cellulose and the like.

When the conductor containing paste for the resistance heating element is to be formed on the surface of the ceramic substrate, a conductor containing paste in which the metal particles and a metal oxide are added and sintered is preferably used. In this manner, when the metal oxide and the metal particles are sintered, the ceramic substrate and the metal particles can be more tightly adhered to each other.

The reason why the adhesion between the ceramic substrate and the metal particles is improved by mixing the metal oxide with the metal particles is not apparent. However, the reason is considered as follows. That is, the metal particle surfaces and the surface of the ceramic substrate consisting of a non-oxide material are slightly oxidized to form oxide films, and the oxide films are sintered and integrated with each other through the metal oxide, so that the metal particles and the ceramic are tightly adhered to each other. In addition, when the ceramic constituting the ceramic substrate is an oxide, naturally, the surface of the ceramic substrate comprises the oxide. For this reason, a conductor layer having excellent adhesion is formed.

An example of the metal oxide is preferably at least one selected from the group consisting of lead oxide, zinc oxide, silica, boron oxide ($B_2O_3$), alumina, yttria and titania.

These oxides can improve the adhesion between the metal particles and the ceramic substrate without increasing the resistance value of the resistance heating element.

A ratio of the lead oxide, zinc oxide, silica, boron oxide ($B_2O_3$), alumina, yttria and titania are preferably, when the total content of metal oxides is set to be 100 parts by weight, 1 to 10 parts by weight for lead oxide, 1 to 30 parts by weight for silica, 5 to 50 parts by weight for boron oxide, 20 to 70 parts by weight for zincoxide, 1 to 10 parts by weight for alumina, 1 to 50 parts by weight for yttria and 1 to 50 parts by weight for titania, respectively, in such a range that the sum of parts by weight not exceeds 100.

When the contents of the oxides are adjusted within the range, especially, the adhesion between the metal particles and the ceramic substrate can be improved.

The content of the metal oxide added to the metal particles is preferably 0.1 wt % or more and less than 10 wt %. The area resistivity obtained when the resistance heating element is formed by using the conductor containing paste having the above constitution is preferably 1 to 45 mΩ/□.

When the area resistivity exceeds 45 mΩ/□, a heating volume is excessively large with respect to an applied voltage. The heating volume cannot be easily controlled by the ceramic substrate. When the content of the metal oxide is 10 wt % or more, the area resistivity exceeds 50 mΩ/□. The heating volume is excessively large, temperature control cannot be easily performed, and the evenness of a temperature distribution deteriorates.

When the resistance heating element is formed on the surface of the ceramic substrate, a metal covering layer is preferably formed on the surface of the resistance heating element. This is because an inner metal sintered body is oxidized to prevent the resistance value from being changed.

The thickness of the metal covering layer to be formed is preferably 0.1 to 10 μm.

As metal used when the metal covering layer is formed, any non-oxidizable metal can be used. More specifically, Examples of the metal include gold, silver, palladium, platinum, nickel and the like. These materials may be used alone or in combination of two or more. Of these materials, nickel is preferably used.

When the resistance heating element is formed inside the ceramic substrate, the surface of the resistance heating element is not oxidized. For this reason, a covering is not required.

When the resistance heating element is arranged on the ceramic substrate constituting the semiconductor-producing/examining device according to the present invention, the device functions as a heater. For this reason, an object to be heated such as a silicon wafer can be heated to a predetermined temperature.

The materials of the ceramic substrates 21 and 31 constituting the semiconductor-producing/examining devices according to the present invention are not limited to specific materials. Examples of the materials include a nitride ceramic, a carbide ceramic, a oxide ceramic and the like.

Examples of the nitride ceramic include a metal nitride ceramic, such as aluminum nitride, silicon nitride, boron nitride, titanium nitride and the like.

Examples of the carbide ceramic include a metal carbide ceramic, such as silicon carbide, zirconium carbide, titanium carbide, tantalum carbide, tungsten carbide and the like.

Examples of the oxide ceramic include a metal oxide ceramic, such as alumina, zirconia, cordierite, mullite and the like.

These ceramics may be used alone or in combination of two or more.

Of these ceramics, the nitride ceramic and the carbide ceramic are desirable more than the oxide ceramic. The nitride ceramic and the carbide ceramic have high heat conductivities.

Aluminum nitride among these nitride ceramics is the most preferable nitride ceramic. Aluminum nitride has the highest heat conductivity of 180 W/m·K.

The ceramic materials may contain a sintering aid. Examples of the sintering aid include an alkaline metal oxide, an alkaline earth metal oxide, a rare earth oxide and the like. Of these sintering aids, CaO, $Y_2O_3$, $Na_2O$, $Li_2O$ and $Rb_2O$ are preferable. The contents of these sintering aids are preferably 0.1 to 10 wt %. The ceramic material may contain alumina.

A ceramic substrate constituting the semiconductor-producing/examining device according to the present invention has a brightness of N6 or less which is a value based on JIS Z 8721. The ceramic substrate has such a brightness is superior in radiation heat and masking capabilities. Such a ceramic substrate can be accurately measured with respect to a surface temperature by a thermoviewer.

The value N of the brightness mentioned is defined as follows. The brightness of ideal black is defined as 0, and the brightness of ideal white is defined as 10. Each color is divided into 10 colors between the brightness of black and the brightness of white such that the perceptions of the brightnesses of the colors have equal rates. The brightnesses are expressed by symbols N0 to N10.

Actual measurement is performed by comparing a color to be measured with color chips corresponding to N0 to N10. In this case, a number of a first decimal place is set to be 0 or 5.

The ceramic substrate having these characteristics can be obtained by incorporating 100 to 5000 ppm of carbon in a ceramic substrate. Carbon includes amorphous carbon and crystalline carbon. The amorphous carbon can suppress a drop of the area resistivity of the ceramic substrate at a high temperature. The crystalline carbon can suppress a deterioration of the heat conductivity of the ceramic substrate at a high temperature. For these reasons, types of carbon can be appropriately selected depending on objects and the like of a substrate to be produced.

The amorphous carbon can be obtained in such a manner that a hydrocarbon consisting of only C, H and O, preferably, a saccharide is fired in the air. As the crystalline carbon, graphite powder and the like can be used.

When an acrylic resin is thermally decomposed in an inert gas atmosphere (nitrogen gas or argon gas) and then heated and pressurized, carbon can be obtained. However, the degree of crystallinity (amorphousness) can be adjusted by changing the acid value of the acrylic resin.

The ceramic substrate preferably has a disk-like shape and a diameter of 200 mm or more. A diameter of 250 mm or more is optimum.

A disk-like ceramic substrate used in a semiconductor substrate requires the evenness of temperature. This is because the temperature of a substrate having a large diameter easily becomes uneven.

The thickness of the ceramic substrate is preferably 50 mm or less, more preferably, 20 mm or less. A thickness of 1 to 5 mm is optimum.

When the thickness is excessively small, warp easily occurs at a high temperature. When the thickness is excessively large, a heat capacity becomes excessively large, temperature-rising dropping properties deteriorates.

The porosity of the ceramic substrate is preferably 0, or 5%or less. This is because deterioration of heat conductivity and occurrence of warp at a high temperature can be suppressed.

A ceramic substrate used in the semiconductor-producing/examining device according to the present invention can be used at 150° C. or more. However, the ceramic substrate is desirably used at 200° C. or more.

In the present invention, a thermocouple can be embedded in the ceramic substrate based on the necessity. The temperature of the resistance heating element is measured by the thermocouple. A voltage and a current are changed on the basis of the resultant data, so that the temperature can be controlled.

The sizes of the connecting portions between the thermocouple and metal wires are equal to or larger than strand diameters of the metal wires, and preferably 0.5 mm or less. With this constitution, the heat capacity of the connecting portions becomes small, and the temperature is accurately and rapidly converted to a current value. For this reason, controllability of temperature is improved, and the temperature distribution of a heating face of the wafer becomes small.

Examples of the thermocouple include, as described in JIS-C-1602 (1980), K-type, R-type, B-type, E-type, J-type and T-type thermocouples.

Concrete examples of the semiconductor-producing/examining device according to the present invention include an electrostatic chuck, wafer prober, a hot plate, susceptor and the like.

The ceramic heater (hot plate) is a device in which only a resistance heating element is formed on the surface of a ceramic substrate or inside the ceramic substrate. In this manner, an object to be heated such as a silicon wafer and the like can be heated to a predetermined temperature.

When an electrostatic electrode is formed inside the ceramic substrate constituting the semiconductor-producing/examining device according to the present invention, the device functions as an electrostatic chuck.

Examples of the electrostatic electrode include an electrostatic electrode consisting of a noble metal (gold, silver, platinum or palladium), a metal such as lead, tungsten, molybdenum or nickel or an electrically conductive ceramic such as a carbide and the like of tungsten or molybdenum. These materials may be used alone or in combination of two or more.

Figure 10:
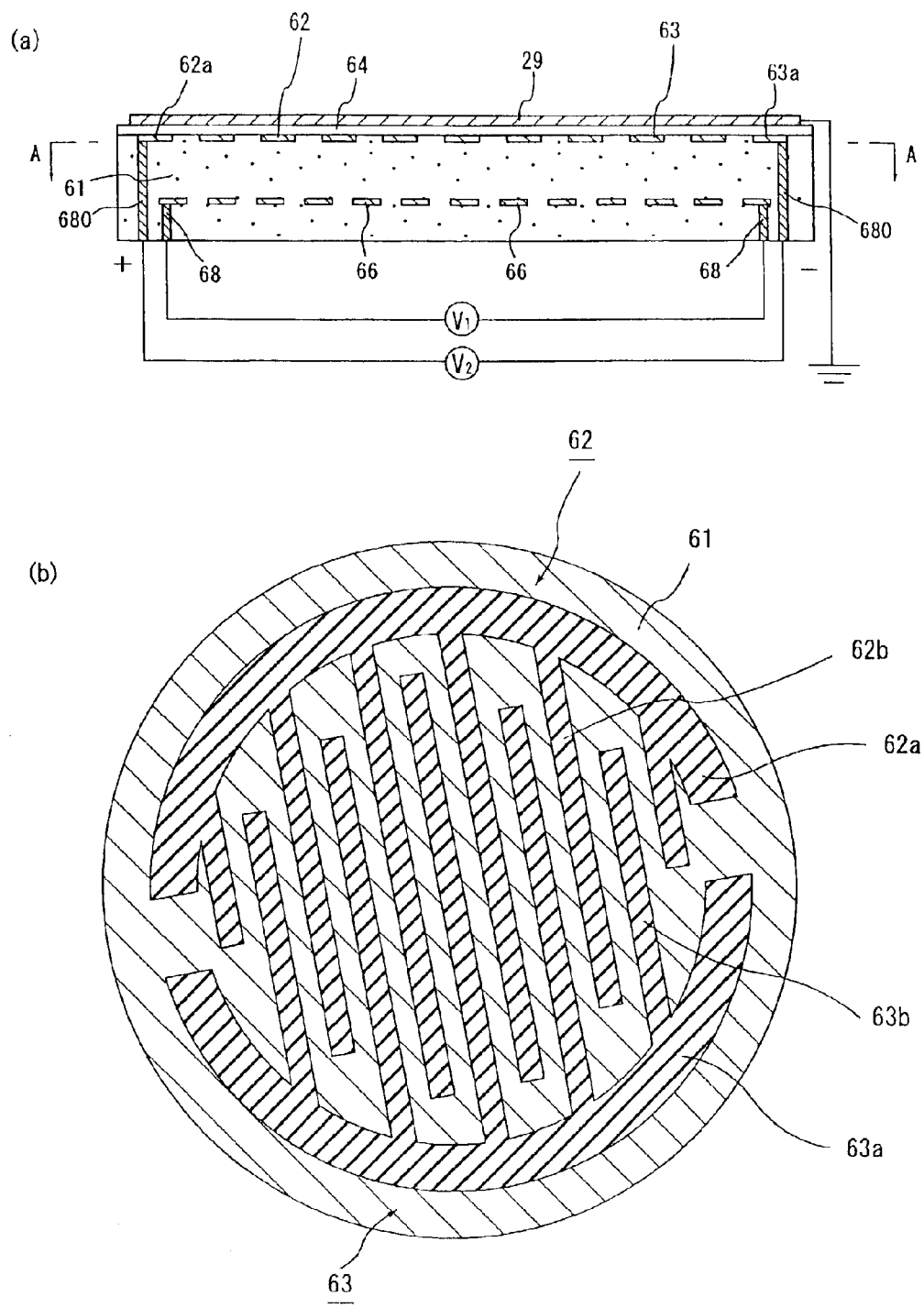
FIG. 10(a) is a longitudinal sectional view schematically showing a ceramic substrate constituting an electrostatic chuck according to the present invention.
FIG. 10(b) is a sectional view of the electrostatic chuck shown along an A—A line in FIG. 10(a).

FIG. 10(a) is a longitudinal sectional view schematically showing a ceramic substrate constituting an electrostatic chuck, and FIG. 10(b) is a sectional view showing the ceramic substrate along an A—A line in FIG. 10(a). In this electrostatic chuck 60, chuck positive and negative electrostatic layers 62 and 63 are embedded in a ceramic substrate 61, and are connected to conductor-filled through holes 680, respectively. A ceramic dielectric film 64 is formed on the electrodes.

Resistance heating elements 66 and conductor-filled through holes 68 are formed inside such that a silicon wafer 29 can be heated. In the ceramic substrate 61, an RF electrode is embedded based on the necessity.

Although not shown, blind holes which expose the conductor-filled through holes 68 are formed below the conductor-filled through holes 68. When the ceramic substrate 3 is arranged in a supporting case, an external terminal is pressed on the conductor-filled through hole 68 exposed from the blind hole by using the elastic force of a leaf spring as in the case of the ceramic heater shown in FIG. 7, so that a connection to an external power supply is achieved.

As shown in FIG. 10(b), the electrostatic chuck 60 is formed to have a circular shape when viewed from the above. The chuck positive electrostatic layer 62 comprising a semicircular arc part 62a and a combteeth-shaped part 62b shown in FIG. 10(b) and the chuck negative electrostatic layer 63 comprising a semicircular arc part 63a and a combteeth-shaped part 63b are arranged opposite to each other such that the combteeth-shaped part 62b and the combteeth-shaped part 63b bite each other.

When this electrostatic chuck is used, the positive side and the negative side of a DC power supply are connected to the chuck positive electrostatic layer 62 and the chuck negative electrostatic layer 63, respectively, and a DC voltage is applied. In this manner, a silicon wafer placed on this electrostatic chuck is electrostatically sucked.

Figure 11:
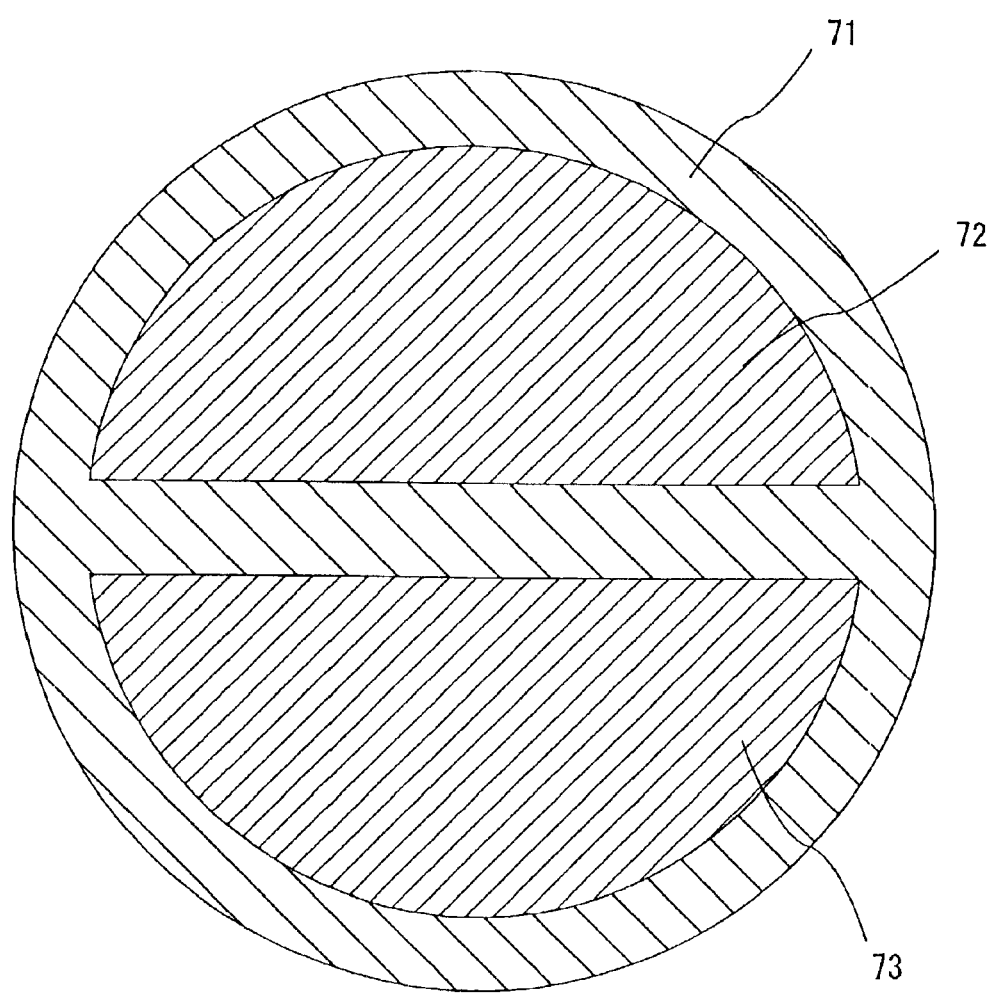
FIG. 11 is a horizontal sectional view schematically showing an example of an electrostatic electrode embedded in the electrostatic chuck according to the present invention.
Figure 12:
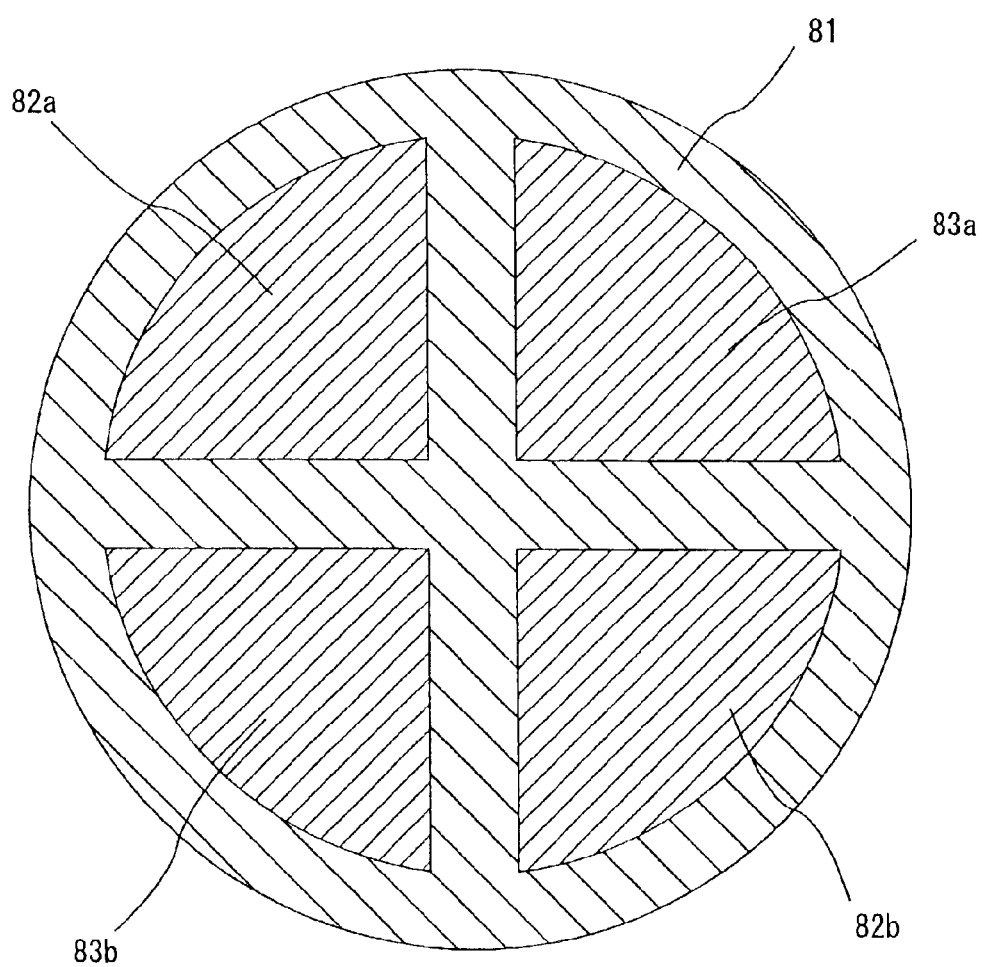
FIG. 12 is a horizontal sectional view schematically showing another example of an electrostatic electrode embedded in the electrostatic chuck according to the present invention.

FIGS. 11 and 12 are horizontal sectional views schematically showing electrostatic electrodes in another electrostatic chuck. In an electrostatic chuck 70 shown in FIG. 11, a semicircular chuck positive electrostatic layer 72 and a semicircular chuck negative electrostatic layer 73 are formed inside a ceramic substrate 71. In an electrostatic chuck 80 shown in FIG. 12, chuck positive electrostatic layers 82a and 82b and chuck negative electrostatic layers 83a and 83b, each having shapes obtained by equally dividing a circle into four parts are formed inside a ceramic substrate 81. The two chuck positive electrostatic layers 82a and 82b and the two chuck negative electrostatic layers 83a and 83b are formed to cross each other.

When the electrodes obtained by dividing an electrode having a circular shape and the like are formed, the number of divided electrodes is not limited to a specific value, and may be 5 or more. The shape of the divided electrodes is not limited to a sector.

When a chuck top conductor layer is formed on the surface of the ceramic substrate constituting the semiconductor-producing/examining device according to the present invention, and when a guard electrode or a ground electrode is arranged inside the ceramic substrate, the device functions as a wafer prober.

Figure 13:
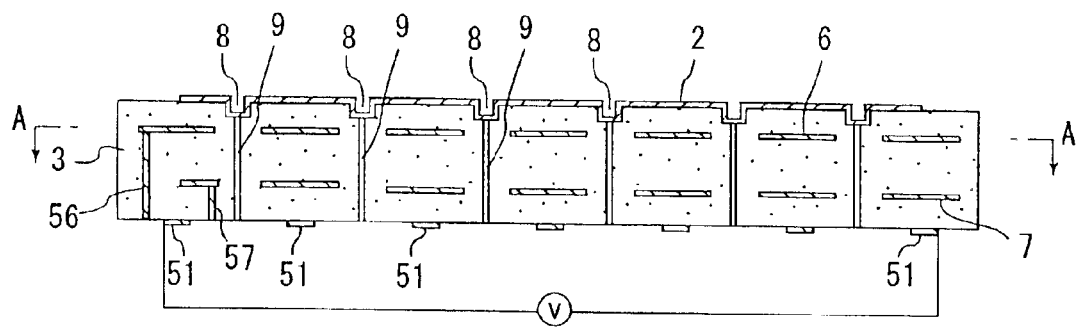
FIG. 13 is a sectional view schematically showing a ceramic substrate constituting a wafer prober which is an example of the semiconductor-producing/examining device according to the present invention.
Figure 14:
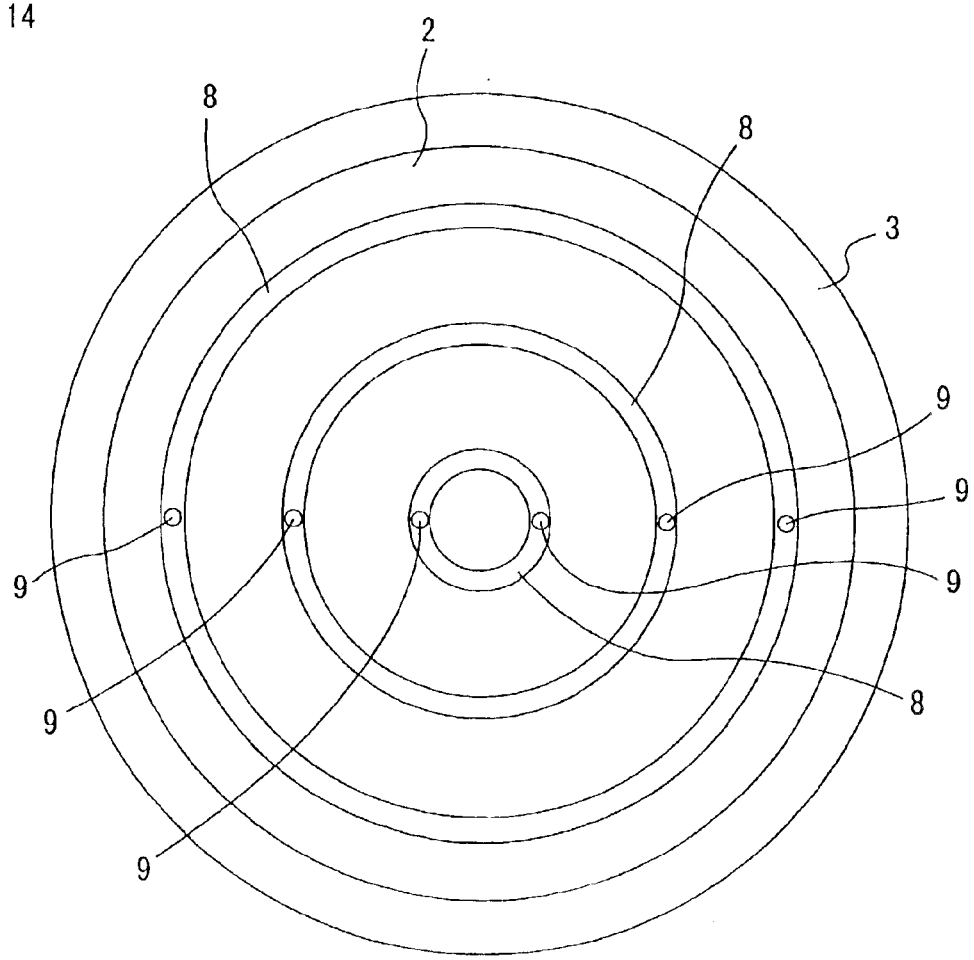
FIG. 14 is a plan view schematically showing the ceramic substrate shown in FIG. 13.

FIG. 13 is a sectional view schematically showing an embodiment of a ceramic substrate constituting the above-mentioned wafer prober. FIG. 14 is a plan view of the ceramic substrate, and FIG. 15 is a sectional view showing the ceramic substrate along an A—A line in FIG. 13.

In this wafer prober, concentric grooves 8 are formed in the surface of a ceramic substrate 3 having a circular shape when viewed from the above, and a plurality of suction holes 9 for sucking a silicon wafer are formed in portions of the grooves 8. A chuck top conductor layer 2 to be connected to the electrodes of the silicon wafer is formed on the large part of ceramic substrate 3 including the grooves 8 to have a circular shape.

On the other hand, in order to control the temperature of the silicon wafer, a resistance heating element 51 having concentric circles-like shapes when viewed from the above as shown in FIG. 1 are formed on the bottom face of the ceramic substrate 3. When this wafer prober is fit in a supporting case, as in the case shown in FIG. 2, external terminals are pressed on both the ends of the resistance heating element 51 by using the elastic force of a leaf spring. Thus, a connection to a power supply is achieved.

Figure 15:
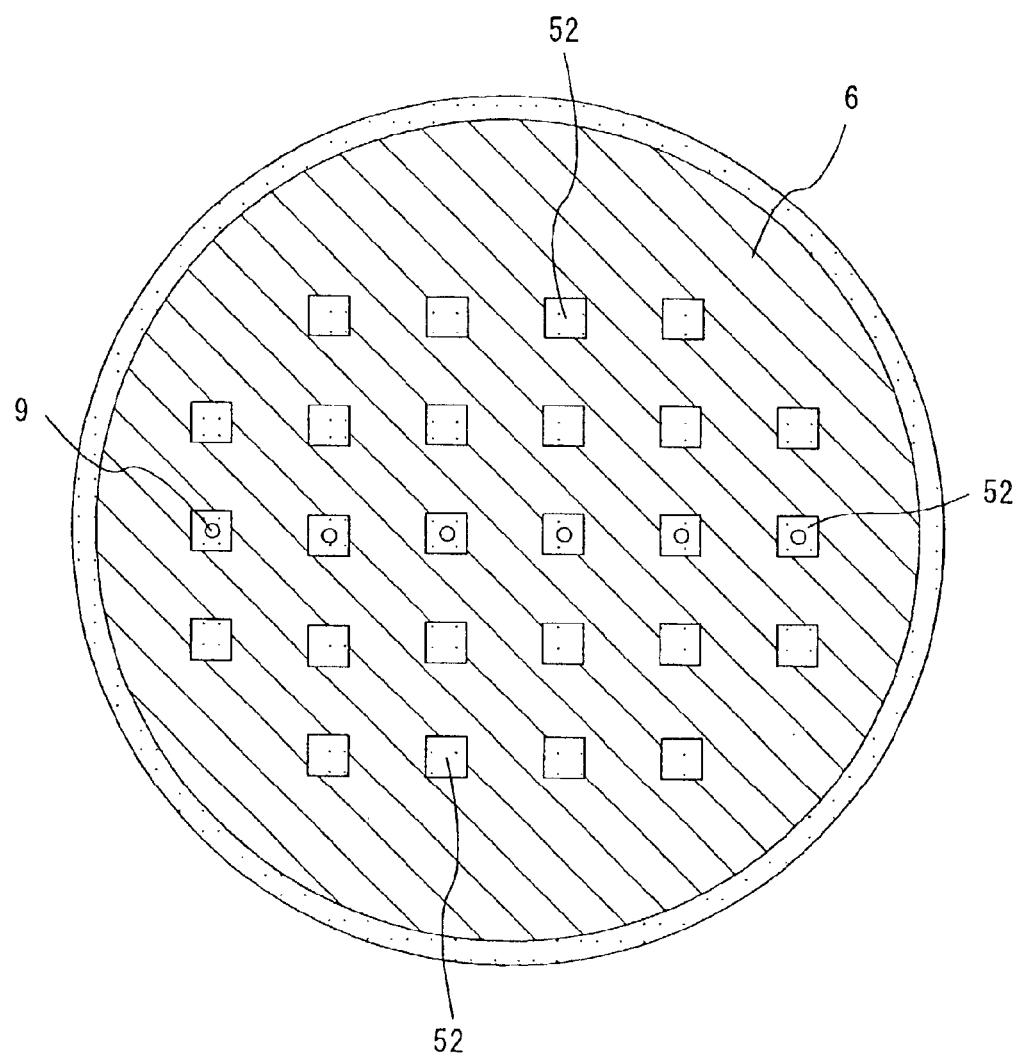
FIG. 15 is a sectional view of a ceramic substrate along an A—A line in FIG. 13.

Guard electrodes 6 and ground electrodes 7 (not shown) arranged in the form of lattice as shown in FIG. 15 are arranged inside the ceramic substrate 3 to remove a stray capacitor and noise. Reference numeral 52 represents an electrode non-formed part. The rectangular electrode non-formed part 52 is formed inside the guard electrodes 6 to tightly adhere upper and lower ceramic substrates 3 to each other through the guard electrodes 6.

In the wafer prober having the above constitution, a silicon wafer on which an integrated circuit is formed is placed on a ceramic substrate accommodated in a supporting case, and a probe card having a tester pin is pressed on the silicon wafer. A continuity test can be performed such that a voltage is applied to the silicon wafer while heating or cooling the silicon wafer.

As an example of the method of producing the semiconductor-producing/examining device according to the present invention, a method of producing a ceramic heater will be described below.

First, a method of producing a ceramic heater which has a resistance heating element on the bottom face of a ceramic substrate (see FIGS. 1 and 2) is explained.

(1) Step of Producing Ceramic Substrate

A sintering aid such as yttria, a binder and the like are added to ceramic powder such as the above-mentioned aluminum nitride to prepare a slurry. This slurry is made into a granular form by a method such as a spray dry method and the like. The obtained granules are put in a mold and the like and pressurized to have a plate-form and the like, thereby forming a raw formed body (green). In preparation of the slurry, amorphous or crystalline carbon may be added.

This raw formed body is heated and fired to be sintered to produce a ceramic plate-formed body. Thereafter, the plate-formed body is processed to have a predetermined shape to produce a ceramic substrate 21. The sintered formed body may have a shape which can be used after firing without any change. Since the formed body is heated and fired while being pressurized, the ceramic substrate 21 which is free from pores can be produced. The heating and the firing may be performed at a temperature equal to or higher than a sintering temperature. In a nitride ceramic, the temperature is 1000 to 2500° C.

In the ceramic substrate, based on the necessity, although not shown, portions which will be through holes in which support pins for supporting a silicon wafer are inserted; portions which will be through holes in which lifter pins for carrying and the like of the silicon wafer are inserted; portions which will be bottomed holes in which temperature-measuring elements such as thermocouples are embedded and the like are formed.

(2) Step of Printing Conductor Containing Paste on the Ceramic Substrate

In general, a conductor containing paste is a fluid which comprises metal particles, a resin and a solvent and has a high viscosity. This conductor containing paste is printed on a portion where a resistance heating element is to be arranged by using screen printing and the like to form a conductor containing paste layer. Since a resistance heating element has to heat the entire ceramic substrate at an even temperature, for example, the conductor containing paste is preferably printed in a concentric circles-like shape or a pattern obtained by combining a concentric circles-like shape and a winding-line shape.

The conductor containing paste layer is preferably formed such that the section of the resistance heating element 22 after firing has a flat square shape.

(3) Firing of Conductor Containing Paste

The conductor containing paste layer printed on the bottom face of the ceramic substrate 21 is heated and fired to remove a resin and a solvent, and the metal particles are sintered to be baked on the bottom face of the ceramic substrate 21, thereby forming a resistance heating element 22. The temperature of heating and firing is preferably 500 to 1000° C.

When the above-mentioned metal oxide is added to the conductor containing paste, the metal particles, the ceramic substrate and the metal oxide are sintered and integrated with each other. For this reason, the adhesion between the resistance heating element and the ceramic substrate is improved.

(4) Formation of Metal Covering Layer

A metal covering layer (not shown) is desirably formed on the surface of the resistance heating element 22.

The metal covering layer can be formed by electroplating, electroless plating, sputtering and the like. However, when mass-productivity is taken into consideration, the electroless plating is optimum.

(5) Attaching of Terminal and the Like

The external terminal 23 is not fixed to an end portion of the resistance heating element 22 with a solder and the like, and the external terminal is fixed to the supporting case by a method to be described later. A thermocouple is inserted into the bottomed hole, and is sealed with a heat-resistant resin such as polyimide or ceramic and the like.

(6) The supporting case 12 is prepared. As shown in FIG. 2, after the intermediate plate 15 and the like are fixed to the supporting case 12, the leaf spring 16 and the resistance heating element 22 are fixed to the intermediate plate 15. The lead wire 17 extending from the external terminal 13 is drawn out of the supporting case 12 through the through hole 14*a*, and other jigs and the like are arranged.

(7) Thereafter, the ceramic substrate having the resistance heating element 22 is fixed to the supporting case 12 shown in FIGS. 1 and 2 through the heat insulating ring 11, so that a connection between the external terminal 13 and the end portion 22*a* of the resistance heating element 22 can be performed.

When the above-mentioned ceramic heater is to be produced, an electrostatic chuck can be produced by arranging electrostatic electrodes inside the ceramic substrate. In addition, by: forming a chuck top conductor layer on a heating face; and arranging guard electrodes and ground electrodes inside the ceramic substrate, a wafer prober can be produced.

When electrodes are arranged inside the ceramic substrate, a metal foil and the like can be embedded in the ceramic substrate. When a conductor layer is formed on the surface of the ceramic substrate, sputtering or plating can be used. Both of the methods may be used together.

Another example of a method of producing a semiconductor-producing/examining device according to the present invention, a method of producing a ceramic heater having a constitution which is different from that of the above-mentioned heater will be described below.

Figure 16:
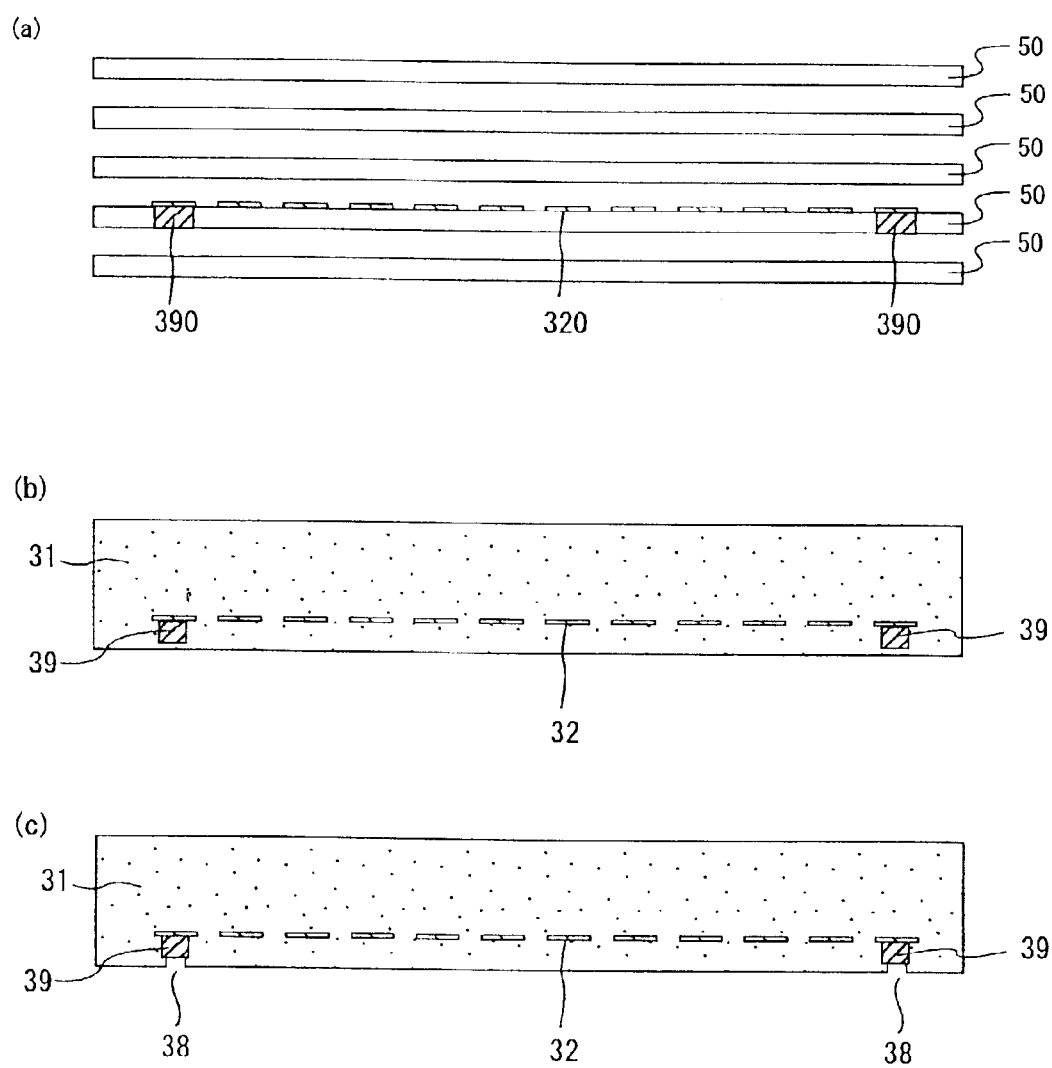
FIGS. 16(a) to 16(c) are sectional views schematically showing a method of producing a ceramic heater which is an example of the semiconductor-producing/examining device according to the present invention.

FIGS. 16(*a*) to 16(*c*) are sectional views schematically showing a method of producing a ceramic heater in which a resistance heating element is arranged inside the ceramic substrate.

(1) Step of Producing Green Sheet

Powder of nitride ceramic is mixed with a binder, a solvent, and the like to prepare a paste. The paste is used to manufacture a green sheet.

As the above-mentioned ceramic powder, aluminum nitride and the like can be used. Based on the necessity, a sintering aid such as yttria and the like may be added to the ceramic powder. When the green sheet is manufactured, crystalline or amorphous carbon may be added.

As the binder, at least one selected from an acrylic binder, ethyl cellose, butyl cellosolve and polyvinyl alcohol is desirable.

In addition, as the solvent, at least one selected from α-Terpineol and glycol is preferable.

A paste obtained by mixing these materials is formed into a sheet by a doctor blade method to manufacture a green sheet 50.

The thickness of the green sheet 50 is preferably 0.1 to 5 mm.

In the obtained green sheet, based on the necessity, portions which will be through holes in which support pins for supporting a silicon wafer are inserted; portions which will be through holes in which lifter pins for carrying and the like of the silicon wafer are inserted; portions which will be bottomed holes in which temperature-measuring elements such as thermocouples and the like are embedded; portions 380 which will be conductor-filled through holes for connecting the resistance heating element and external terminals; and the like are formed. After the green sheet lamination to be described later is formed, the above-mentioned processing may be performed.

(2) Step of Printing Conductor Containing Paste on Green Sheet

A metal paste or a conductor containing paste containing an electrically conductive ceramic is printed on the green sheet 50 to form a conductor containing paste layer 220.

These conductor containing pastes contain metal particles or electrically conductive ceramic particles.

An average particle diameter of tungsten particles, molybdenum particles and the like which are the above-mentioned metal particles are preferably 0.1 to 5 μm. When the average particle is less than 0.1 μm or exceeds 5 μm, the conductor containing paste is not easily printed.

Examples of these conductor containing paste include a composition (paste) obtained by mixing 85 to 87 parts by weight of metal particles or electrically conductive ceramic particles; 1.5 to 10 parts by weight of at least one binder selected from an acrylic binder, ethyl cellose, butyl cellosolve and polyvinyl alcohol; and 1.5 to 10 parts by weight of at least one solvent selected from α-Terpineol and glycol.

(3) Step of Laminating Green Sheet

Green sheets 50 which are manufactured in the step (1) on which no conductor containing pastes are printed, are laminated on the upper and lower faces of a green sheet 50 manufactured in the step (2), on which a conductor containing paste layer 220 is printed (FIG. 16(*a*)).

At this time, the number of green sheets 50 laminated on the upper side is made larger than the number of green sheets 50 laminated on the lower side to bias the position where the resistance heating element 22 is formed toward the bottom face.

More specifically, the number of green sheets 50 on the upper side is preferably 20 to 50, and the number of green sheets 50 on the lower side is preferably 5 to 20.

(4) Step of Firing Green Sheet Lamination

A green sheet lamination is heated and pressurized to sinter the green sheets 50 and the conductor containing pastes formed therein, so that a ceramic substrate 31 is produced (FIG. 16(*b*)).

The heating temperature is preferably 1000 to 2000° C., and the pressure of the pressurizing is preferably 10 to 20 MPa. The heating is performed in an inert gas atmosphere. As an inert gas, for example, argon, nitrogen and the like can be used.

In the obtained ceramic substrate 31, a bottomed hole (not shown) in which a temperature-measuring element is to be inserted, blind holes 37 in which external terminals are to be inserted and the like are formed (FIG. 16 (*c*)). The bottomed holes and the blind holes 37 can be formed by performing drilling and a blast treatment such as sand blast after the surface is ground.

An external terminal is not soldered on the conductor-filled through hole 38 exposed from the blind hole 37. As shown in FIG. 7, the external terminal 13 is brought into contact with the conductor-filled through hole 38 to perform a connection between the external terminal and the resistance heating element.

(5) Thereafter, the supporting case 12 is prepared, and the intermediate plate 15 is fixed to the supporting case 12. Thereafter, the leaf spring 16 and the external terminal 13 are fixed to the intermediate plate 15, and the lead wire 17 extending from the external terminal 13 is drawn out of the supporting case 12 through the through hole 14*a*.

(6) Thereafter, the ceramic substrate having the resistance heating element is fixed to the supporting case 12 shown in FIGS. 1 and 2 through the heat insulating ring 11, so that a connection between the external terminal 13 and the end portion 22*a* of the resistance heating element 22 can be performed.

In the above-mentioned ceramic heater, a silicon wafer and the like is placed on the ceramic heater, or a silicon wafer and the like is held by support pins. Thereafter, various operations can be performed while heating or cooling the silicon wafer and the like.

When the above-mentioned ceramic heater is to be produced, an electrostatic chuck can be produced by arranging electrostatic electrodes inside the ceramic substrate. In addition, by: forming a chuck top conductor layer on a heating face; and arranging guard electrodes and ground electrodes inside the ceramic substrate, a wafer prober can be produced.

When electrodes are arranged inside the ceramic substrate, as in the case in which the resistance heating element is formed, a conductor containing paste layer may be formed on the surface of the green sheet. When a conductor layer is formed on the surface of the ceramic substrate, sputtering or plating can be used. Both the methods may be used together.

Best Modes for Carrying Out the Invention

The present invention will be described below in detail.

EXAMPLE 1

Producing of Ceramic Heater (1) A composition comprising 100 parts by weight of aluminum nitride powder (made by TOKUYAMA Corp., average particle diameter: 1.1 μm), 4 parts by weight of yttrium oxide ($Y_2O_3$: yttria, average particle diameter: 0.4 μm), 12 parts by weight of acrylic binder, and alcohol was subjected to spray drying to manufacture granular powder.

(2) The granular powder was put in a mold and formed to have a flat plate form to obtain a raw formed body (green).

(3) The raw formed body subjected to the processing treatment was hot-pressed at a temperature: 1800° C. and a pressure: 20 MPa to obtain an aluminum nitride sintered body having a thickness of 3 mm.

A disk-like body having a diameter of 210 mm was cut from the sintered body to obtain a plate-formed body (ceramic substrate 21) consisting of a ceramic.

The plate-formed body was subjected to drilling to form a portion for a through hole in which a lifter pin for a silicon wafer was to be inserted and a portion for a bottomed hole in which a thermocouple would be embedded (diameter: 1.1 mm, depth: 2 mm).

(4) A conductor containing paste was printed on the bottom face of the sintered body obtained in (3) by screen printing. A printed pattern has a concentric circles-like shape as shown in FIG. 1.

As the conductor containing paste, Solvest PS603D which was made by TOKURIKI KAGAKU KENKYUSHO and used in formation of a plated through hole of a printed circuit board was used.

This conductor containing paste was a silver-lead paste. The silver-lead paste contained 100 parts by weight of silver and 7.5 parts by weight of a metal oxide consisting of lead oxide (5 wt %), zinc oxide (55 wt %), silica (10 wt %), boron oxide (25 wt %) and alumina (5 wt %). The silver particles had an average particle diameter of 4.5 μm and a scaly shape.

(5) The sintered body on which the conductor containing paste was printed was fired at 780° C. to sinter silver and lead in the conductor containing paste. Thus, they were baked on the sintered body to form a resistance heating element 22. The silver-lead resistance heating element 22 had a thickness of 5 μm, a width of 2.4 mm, and an area resistivity of 7.7 mΩ/□.

(6) The sintered body produced in (5) was dipped in an electroless plating bath comprising an aqueous solution having a concentration given by: 80 g/l of nickel sulfate, 24 g/l of sodium hypophosphite, 12 g/l of sodium acetate, 8 g/l of boric acid and 6 g/l of ammonium chloride to deposit a metal covering layer 220 (nickel layer) (not shown) having a thickness of 1 μm on the surface of the silver-lead resistance heating element 22.

(7) A thermocouple for controlling a temperature was inserted into the bottomed hole, and polyimide resin was filled in the bottomed hole and cured at 190° C. for 2 hours.

(8) The supporting case 12 was prepared, and the intermediate plate 15 was fixed to the supporting case 12. Thereafter, the leaf spring 16 and the external terminal 22 were fixed to the intermediate plate 15, and the lead wire 17 extending from the external terminal 13 was drawn out of the supporting case 12 through the through hole 14a.

(9) Thereafter, the ceramic substrate 21 having the resistance heating element 22 on the bottom portion thereof was fixed to the supporting case 12 shown in FIGS. 1 and 2 through the heat insulating ring 11, so that a connection between the external terminal 13 and the end portion 22a of the resistance heating element 22 were performed. In this manner, the producing (assembling) of the ceramic heater was completed.

EXAMPLE 2

Ceramic Heater (see FIG. 16)

(1) A paste obtained by mixing 100 parts by weight of aluminum nitride powder (made by TOKUYAMA Corp., average particle diameter: 1.1 μm), 4 parts by weight of yttrium oxide ($Y_2O_3$: yttria, average particle diameter: 0.4 μm), 11.5 parts by weight of acrylic binder, 0.5 parts by weight of dispersant with 53 parts by weight of alcohol comprising 1-butanol and ethanol was used, and was formed by a doctor blade method to form a green sheet 50 having a thickness of 0.47 mm.

(2) After the green sheet 50 was dried at 80° C. for 5 hours, a portion where a through hole in which a lifter pin for carrying and the like of a silicon wafer was to be inserted, a portion 380 which would be a conductor-filled through hole and the like were formed by punching.

(3) One hundred parts by weight of tungsten carbide particle having an average particle diameter of 1 μm, 3.0 parts by weight of acrylic binder, 3.5 parts by weight of α-Terpineol solvent and 0.3 parts by weight of dispersant were mixed with each other to prepare a conductor containing paste A.

One hundred parts by weight of tungsten particle having an average particle diameter of 3 μm, 1.9 parts by weight of acrylic binder, 3.7 parts by weight of α-Terpineol solvent and 0.2 parts by weight of dispersant were mixed with each other to prepare a conductor containing paste B.

The conductor containing paste A was printed on the green sheet by screen printing to form the conductor containing paste layer 220 for the resistance heating element 22. The print pattern was the concentric circles-like pattern as shown in FIG. 1. The width of the conductor containing paste layer was set to be 10 mm, and the thickness of the conductor containing paste was set to be 12 μm. The conductor containing paste B was filled in the portion 380 to be a conductor-filled through hole.

On the green sheet subjected to the above-mentioned processing treatment, 37 green sheets on which no tungsten pastes were printed were laminated on the upper side (heating face) and 13 green sheets on which no tungsten pastes were printed were laminated on the lower side at 130° C. and a pressure of 8 MPa (FIG. 16(a)).

(4) The obtained lamination was degreased at 600° C. for 5 hours in a nitrogen gas and hot-pressed at 1890° C. and a pressure of 15 MPa for 10 hours to obtain an aluminum nitride sintered body having a thickness of 3 mm. The aluminum nitride was cut into a disk-like body having a diameter of 230 mm to obtain the ceramic substrate 31 in which the resistance heating element 22 having a thickness of 6 μm and a width of 10 mm (aspect ratio: 1666) and the conductor-filled through hole 38 were formed (FIG. 16(b)).

(5) After the plate-formed body obtained in (4) is ground by a diamond grindstone, a mask was placed on the plate-formed body, and a bottomed hole for a thermocouple was formed in the surface of the plate-formed body by a blast treatment using glass beads.

(6) In addition, a portion immediately below the conductor-filled through hole 38 was hollowed out by a drill to form the blind hole 37 having a diameter of 3.0 mm and a depth of 0.5 mm, thereby exposing the conductor-filled through hole 38 (FIG. 16(c)).

(7) A plurality of thermocouples for controlling temperature were embedded in bottomed holes, and polyimide resin was filled in the bottomed holes and cured at 190° C. for 2 hours.

(8) Thereafter, the supporting case 12 was prepared, and the intermediate plate 15 was fixed to the supporting case 12. Thereafter, the leaf spring 16 and the external terminal 13 having a connection portion, the diameter of which was almost equal to the diameter of the blind hole 37, were fixed to the intermediate plate 15, and the lead wire 17 extending from the external terminal 13 was drawn out of the supporting case 12 through the through hole 14a.

(9) The ceramic substrate 31 having the resistance heating element 22 formed therein was fixed to the supporting case 12 shown in FIGS. 1 and 2 through the heat insulating ring 11, so that the external terminal was pressed on the conductor-filled through hole exposed from the blind hole. In this manner, a connection between the resistance heating element and the external terminal was performed, and the producing (assembling) of the ceramic heater was completed.

EXAMPLE 3

A ceramic substrate in which a conductor-filled through hole was exposed was produced, and the surface of the exposed conductor-filled through hole was subjected to grinding and the like. Thereafter, the ceramic substrate was subjected to nickel plating and gold plating under the following conditions. Except for these processes, the same processes as those in Example 2 were performed to produce a ceramic heater.

The ground surface of the conductor-filled through hole was dipped for 20 minutes in an electroless nickel plating solution which had a pH value of 5 and contained 30 g/l of nickel chloride, 10 g/l of sodium hypophosphite, 10 g/l of sodium citrate to form a nickel plating layer 39a having a thickness of 5 μm on the opening part of the conductor-filled through hole. In addition, the resultant structure was dipped in at 93° C. for 23 seconds in an electroless plating bath containing 2 g/l of potassium cyanoaurate, 75 g/l of ammonium chloride, 12 g/l of sodium citrate, 10 g/l of sodium hypophosphite to form a gold plating layer 39b having a thickness of 0.03 μm.

COMPARATIVE EXAMPLES 1 to 2

A connection of a resistance heating element and an external terminal was performed in such a manner that heating reflow was performed at 980° C. by using a solder material consisting of an Au/Ni alloy (Au: 82%, Ni: 18%). Except for this process, the same processes as those in Examples 1 and 2 were performed to produce a ceramic substrate having a resistance heating element. In Comparative Example 2, an external terminal was soldered onto a conductor-filled through hole exposed from a blind hole.

Thereafter, the ceramic substrate to which the external terminal was connected was fixed to the supporting case 12 through the heat insulating ring 11, and a lead wire and other wires were drawn out of the through hole 14a of the bottom plate 14. In this manner, the producing of the ceramic heater was completed.

COMPARATIVE EXAMPLE 3

Except that no conductor-filled through hole was formed, the same method as described in (1) to (5) in Example 2 was performed to produce a ceramic substrate. A face for processing the semiconductor, of the ceramic substrate was ground to expose an area including an end portion of the resistance heating element, and a metal covering layer was formed by the same method as that in (6) in Example 1 on the surface of the exposed resistance heating element.

Thereafter, in the method disclosed in JP Kokai Hei 3-230489, a leaf-spring-shaped external terminal was brought into contact with the end portion of the resistance heating element and connected to the end portion.

A thermocouple was embedded in the bottomed hole, polyimide resin was filled in the bottomed hole and cured at 190° C. for 2 hours.

The ceramic substrate to which the external terminal was connected was fixed to a supporting case, the lead wire extending from the external terminal was drawn out of the supporting case 12. In this manner, the producing (assembling) of the ceramic heater is completed.

The ceramic heaters according to Examples 1 to 3 and Comparative Examples 1 to 3 obtained as described above were kept at 25° C. for a predetermined period of time. Thereafter, the temperatures of the ceramic heaters were raised to 450° C. and kept for a predetermined period of time, and the ceramic heaters were cooled again and kept at 25° C. A heat cycle test which repeated these steps 1000 times was performed to inspect the connection states of the external terminals and the resistance heating elements.

As a result, in the ceramic heaters according to Examples 1 to 3, all the connection portions kept preferable connection states. These heaters had no problems in connectivity. However, in the ceramic heaters according to Comparative Examples 1 to 2, solder materials begun to deteriorate and fell away.

The temperatures of the ceramic heaters according to Examples 1 to 3 and Comparative Example 3 were raised to 300° C., and the differences between the highest temperatures and the lowest temperatures of the face for processing the semiconductor of the ceramic substrates were measured by a thermoviewer.

The temperature difference was 5° C. in Example 1, the temperature difference was 6° C. in Example 2 and the temperature difference was 6° C. in Example 3. That is, small temperature differences were obtained. However, the temperature difference was large, that is, 15° C. in Comparative example 3. In particular, the temperature of the periphery of the external terminal was significantly low.

It could be considered that heat of the ceramic substrate escaped through the external terminal.

In addition, the ceramic heaters according to Examples 1 and 2 and Comparative Example 3 were kept at 25° C. for a predetermined period of time. Thereafter, the temperatures of the ceramic heaters were raised to 450° C. and kept for a predetermined period of time, and the ceramic heaters were cooled again and kept at 25° C. A heat cycle test which repeated these steps 5000 times was performed, and the contact portions between the external terminals and the conductor layers were observed with an optical microscope. As a result, the contact portions between the external terminals and the conductor layers were worn in Example 1 and Comparative Example 3.

However, when the contact between the external terminal and the conductor layer was performed in a blind hole (concave portion) as in Example 2, the external terminal was fixed. For this reason, the contact portion between the external terminal and the conductor layer was not worn.

INDUSTRIAL APPLICABILITY

As has been described above, according to a semiconductor-producing/examining device of the present invention, a connection between a conductor layer and an external terminal formed on a ceramic substrate is performed such that the external terminal is pressed on the conductor layer and the like by using the elastic force and the like of an elastic body. Therefore, unlike a case in which an external terminal is adhered through a solder material and the like, a defective connection between an external terminal and a conductor layer caused by deterioration of a solder material and the like does not occur, and a preferable connection state can be maintained for a long period of time. Since a connection between a conductor layer and an external terminal is performed such that the conductor layer and the external terminal are brought into contact with each other, a ceramic substrate can be easily removed from a supporting case.

What is claimed is:

1. A device used to produce or examine semiconductors comprising:

a ceramic substrate having a resistance heating element formed on the surface thereof; and a supporting case, wherein an external terminal is connected to said resistance heating element, and said external terminal is pressed on said resistance heating element, or said external terminal is pressed on a conductor layer connected to said resistance heating element.

2. The device used to produce or examine semiconductors according to claim 1, further comprises:

an elastic body, wherein elasticity of said elastic body is used to connect said external terminal and said resistance heating element, or to connect said external terminal and said conductor layer.

3. The device used to produce or examine semiconductors according to claim 1, wherein said resistance heating element comprises:

two or more circuits.

4. The device used to produce or examine semiconductors according to claim 1, wherein said resistance heating element comprises:

a metal particle; and a metal oxide.

5. The device used to produce or examine semiconductors according to claim 1, further comprising:
a heat insulating ring, wherein
said ceramic substrate is fixed to said supporting case interposing said heat insulating ring between said ceramic substrate and said supporting case.

6. The device used to produce or examine according to claim 1, wherein said ceramic substrate comprises:
a through hole for inserting a lifter pin.

7. A device used to produce or examine semiconductors, comprising:
a ceramic substrate having a resistance heating element formed inside thereof;
a supporting case; and
an external terminal connected to said resistance heating element, wherein
said external terminal is pressed on said resistance heating element, or said external terminal is pressed on a conductor layer connected to said resistance heating element.

8. The device used to produce or examine semiconductors according to claim 7, further comprising:
an elastic body, wherein
elasticity of said elastic body is used to connect said external terminal and said resistance heating element, or to connect said external terminal and said conductor layer.

9. The device used to produce or examine semiconductors according to claim 7, wherein said resistance heating element comprises:
two or more circuits.

10. The device used to produce or examine semiconductors according to claim 7, wherein said ceramic substrate comprises:
a through hole for inserting a lifter pin.

* * * * *

UNITED STATES PATENT AND TRADEMARK OFFICE
CERTIFICATE OF CORRECTION

| | | |
|---|---|---|
| PATENT NO. | : 7,071,551 B1 | Page 1 of 1 |
| APPLICATION NO. | : 10/030123 | |
| DATED | : July 4, 2006 | |
| INVENTOR(S) | : Yasuji Hiramatsu et al. | |

It is certified that error appears in the above-identified patent and that said Letters Patent is hereby corrected as shown below:

Column 22, line 52, change "comprises:" to --comprising:--.

Column 23, Line 7, change "The device used to produce or examine according to" to -- The device used to produce or examine semiconductors according to--.

Signed and Sealed this

Ninth Day of January, 2007

JON W. DUDAS
*Director of the United States Patent and Trademark Office*